(12) United States Patent
Muraoka et al.

(10) Patent No.: US 7,384,484 B2
(45) Date of Patent: Jun. 10, 2008

(54) SUBSTRATE PROCESSING METHOD, SUBSTRATE PROCESSING APPARATUS AND SUBSTRATE PROCESSING SYSTEM

(75) Inventors: Yusuke Muraoka, Kyoto (JP); Kimitsugu Saito, Kyoto (JP); Tomomi Iwata, Kyoto (JP); Eiji Fukatsu, Kyoto (JP); Ikuo Mizobata, Kyoto (JP); Hiroyuki Ueno, Kyoto (JP); Yasuo Okuyama, Kyoto (JP); Takashi Gama, Kyoto (JP); Yoshihiko Sakashita, Hyogo (JP); Katsumi Watanabe, Hyogo (JP); Jun Munemasa, Hyogo (JP); Hisanori Oshiba, Hyogo (JP); Shogo Sarumaru, Hyogo (JP)

(73) Assignees: Dainippon Screen Mfg. Co., Ltd. (JP); Kabushiki Kaisha Kobe Seiko Sho (JP)

( * ) Notice: Subject to any disclaimer, the term of this patent is extended or adjusted under 35 U.S.C. 154(b) by 0 days.

(21) Appl. No.: 10/700,020

(22) Filed: Nov. 3, 2003

(65) Prior Publication Data
US 2004/0105936 A1  Jun. 3, 2004

(30) Foreign Application Priority Data
Nov. 18, 2002 (JP) ............................. 2002-334115
Dec. 5, 2002 (JP) ............................. 2002-353315

(51) Int. Cl.
B05C 13/02 (2006.01)
B05B 1/26 (2006.01)
B05B 7/00 (2006.01)
C23C 14/00 (2006.01)
B08B 3/00 (2006.01)
H01L 21/677 (2006.01)

(52) U.S. Cl. .................. 118/503; 118/50; 118/326; 118/313; 134/61; 134/76; 134/902; 414/225.01; 414/217

(58) Field of Classification Search .............. 118/52, 118/612, 50, 320, 500, 503, 326, DIG. 7, 118/313; 438/710; 134/902, 61, 76, 78; 414/222.01, 226.04, 225.01, 217
See application file for complete search history.

(56) References Cited

U.S. PATENT DOCUMENTS 5,651,823 A * 7/1997 Parodi et al. ................ 118/500

(Continued)

FOREIGN PATENT DOCUMENTS

| DE | 195 06 404 C1 | 3/1996 |
|---|---|---|
| EP | 0 732 557 A2 | 9/1996 |
| EP | 0 992 852 A2 | 4/2000 |
| JP | 8-250464 | 9/1996 |

(Continued)

OTHER PUBLICATIONS

A Concise Explanation sheet.

*Primary Examiner*—Yewebdar Tadesse
(74) *Attorney, Agent, or Firm*—Ostrolenk, Faber, Gerb & Soffen

(57) ABSTRACT

After subjected to a developing process, a rinsing process and a replacing process in this order in a developing unit 10A, 10B, a substrate W wet with an anti-drying solution is wet-transported to a supercritical drying unit 20 by a primary transport robot 30. The supercritical drying unit 20 performs a high-pressure drying process (supercritical drying process) in a dedicated manner. Accordingly, by virtue of the presence of the anti-drying solution, the substrate W is effectively prevented from becoming air-dry during the transportation of the substrate W.

8 Claims, 13 Drawing Sheets

U.S. PATENT DOCUMENTS

| | | | |
|---|---|---|---|
| 5,700,379 A | 12/1997 | Biebl | 216/2 |
| 5,826,129 A * | 10/1998 | Hasebe et al. | 396/611 |
| 6,239,038 B1 * | 5/2001 | Wen | 438/745 |
| 6,358,673 B1 | 3/2002 | Namatsu | 430/311 |
| 6,554,507 B2 | 4/2003 | Namatsu | 396/611 |
| 2002/0132192 A1 | 9/2002 | Namatsu | 430/322 |
| 2002/0160625 A1 | 10/2002 | Inoue et al. | 438/780 |
| 2004/0043138 A1 * | 3/2004 | Jagannathan et al. | 427/66 |

FOREIGN PATENT DOCUMENTS

| | | |
|---|---|---|
| JP | 11-87306 | 3/1999 |
| JP | 2000-91180 | 3/2000 |
| JP | 2000-138156 | 5/2000 |
| JP | 2000-223467 | 8/2000 |
| JP | 3343219 | 8/2002 |
| JP | 2002-329650 | 11/2002 |
| JP | 2003-51475 | 2/2003 |

\* cited by examiner

SUBSTRATE PROCESSING METHOD, SUBSTRATE PROCESSING APPARATUS AND SUBSTRATE PROCESSING SYSTEM

BACKGROUND OF THE INVENTION

1. Field of the Invention

The present invention relates to a substrate processing method of performing sequential processes from a predetermined wet process to a drying process on a variety of substrates such as semiconductor wafers, glass substrates for photomask, glass substrates for liquid crystal display, glass substrates for plasma display, optical disk substrates (hereinafter, simply referred to as "substrate"), as well as to a substrate processing apparatus and a substrate processing system suited for such a method.

2. Description of the Related Art

In recent years, the semiconductor devices have been speeding toward fine structure which has raised new problems in the substrate processing field. In a case where a fine pattern is formed by patterning a resist applied on a substrate, for example, a wet developing process and a drying process are performed in this order. In the wet developing process for developing the resist applied on the substrate, an alkaline developing process and a rinsing process are carried out, for example. Specifically, the alkaline developing process uses an aqueous alkaline solution for removal of unwanted resist, whereas the rinsing process uses a rinse liquid such as pure water for removal of the aqueous alkaline solution (for terminating the developing process). In the drying process, on the other hand, the substrate is rotated thereby subjecting the rinse liquid remaining on the substrate to centrifugal force for removing the rinse liquid. Thus is dried the substrate (spin drying). In the drying process, the substrate encounters the appearance of interface between the rinse liquid on the substrate and gas as the drying process proceeds. When such an interface appears in a gap between fine pattern portions of a semiconductor device, the fine pattern portions are drawn toward each other by the surface tension of the rinse liquid so that the fine pattern portions are collapsed.

In addition, fluid resistance produced in the spin drainage of the rinse liquid, pressure acting to discharge the rinse liquid from the fine pattern portions, and the air resistance and centrifugal force associated with the high-speed rotation in excess of 3000 rpm are thought to be involved in the collapse of the fine pattern portions.

As a solution to this problem, there has been proposed a supercritical drying process wherein the substrate is retained in a pressure container while a supercritical fluid having properties of low viscosity, high diffusivity and no surface tension (hereinafter, referred to as "SCF") is introduced into the pressure container for accomplishing the supercritical drying of the substrate.

For instance, an apparatus described in Japanese Unexamined Patent Publication No. 2000-223467 (hereinafter, referred to as "Patent Document 1") is adapted to retain, in a reaction chamber, a substrate subjected to the developing process (alkaline developing process and rinsing process). With the substrate retained in the reaction chamber, the apparatus activates a pump unit to pump a given amount of liquefied carbon dioxide from a cylinder into the reaction chamber. In the meantime, the pressure of carbon dioxide in the reaction chamber is automatically controlled by way of a pressure control valve so as to be maintained in the range of 7.38 to 8 MPa whereby the carbon dioxide in the reaction chamber is transformed to the supercritical fluid. Subsequently, the supercritical fluid is released from the reaction chamber to reduce the pressure in the reaction chamber, whereby the substrate is allowed to dry.

The supercritical drying apparatus is dedicated solely to the drying process and hence, the developing process (alkaline developing process and rinsing process) is carried out in a developing apparatus separate from the drying apparatus. In order to subject the substrate to the sequential substrate processes from the developing process to the drying process, the conventional practice requires the substrate wet with the rinse liquid to be transported to the supercritical drying apparatus after the performance of the alkaline developing process and rinsing process in the developing apparatus. This is because if the substrate becomes air-dry during the transportation from the developing apparatus to the supercritical drying apparatus, the fine pattern portions are drawn toward each other by the surface tension of the rinse liquid so as to be collapsed. As a consequence, the performance of the supercritical drying means nothing.

As a solution, it may be contemplated to provide a developing unit functioning as the developing apparatus and a high-pressure processing unit functioning as the supercritical drying apparatus in the same apparatus, which is further provided with a transport robot as a transport unit which may wet-transport the substrate developed by the developing unit to the high-pressure processing unit.

Unfortunately, the aforesaid substrate processing apparatus including the developing unit, the high-pressure processing unit and the transport robot takes only the alkaline developing process into consideration, thus suffering poor versatility. The developing process taken in the fabrication process for fabricating electronic components such as used in semiconductor apparatuses and liquid crystal display units is not limited to the aforesaid alkaline developing process but includes a plurality of developing processes. In cases, for example, in place of the alkaline developing solution, an organic developing solution such as butyl acetate may be used according to a film material for forming a resist film. The developing process using the organic developing solution may be followed by the rinsing process using isopropyl alcohol (IPA) as the rinse liquid.

In order to enhance the versatility of the substrate processing apparatus, it may be contemplated to provide the processing apparatus not only with the alkaline developing unit, an alkaline-development transport robot for transporting an alkaline developed substrate and a high-pressure processing unit which carry out the alkaline developing process, but also with an organic developing unit for performing an organic developing process, an organic-development transport robot for transporting an organically developed substrate and a high-pressure processing unit which carry out the organic developing process. However, such a substrate processing apparatus provided with the special transport units (the alkaline-development transport robot and the organic-development transport robot) corresponding to the individual developing contents is detrimentally increased in size and costs.

On the other hand, a substrate processing apparatus has been proposed which is designed to perform a wet process such as the developing process and a high-pressure drying process using the SCF in the same reactor. According to an apparatus disclosed in Japanese Unexamined Patent Publication No. 11-87306 (hereinafter, referred to as "Patent Document 2"), for example, when a processing fluid, such as a rinse liquid, an etching solution or a developing solution, is introduced from a liquid tank into the reactor with a substrate set at place therein, the processing fluid in the reactor is stirred by a rotating mechanism so that a smooth and consistent wet process is effected. Subsequently, a rinse liquid in place of the processing solution is introduced from a liquid tank into the reactor for carrying out the rinsing process. Thereafter, the rinse liquid is discharged from the reactor while the SCF from a gas cylinder is introduced into the reactor. Thus, the rinse liquid is replaced with the SCF. Then, the SCF is slowly discharged for carrying out the supercritical drying process or the high-pressure drying process. That is, this substrate processing apparatus negates the need for transporting the substrate from the developing apparatus to the supercritical drying apparatus. Therefore, there occurs no problem that the substrate becomes air-dry during the transportation so that the fine pattern portions are collapsed as drawn toward each other by the surface tension of the rinse liquid.

However, the following problem is encountered by the conventional apparatus wherein the wet process and the high-pressure drying process are sequentially performed in a single reactor. Specifically, the substrate processing apparatus designed to perform the high-pressure drying process has more limiting conditions than the conventional substrate processing apparatus widely used in the art or the substrate processing apparatus carrying out surface treatment under normal pressures. The most crucial one of the limiting conditions is that the range of selection of the processing fluid is limited. The reason is as follows. This substrate processing apparatus must employ a pressure container as the reactor. Where a corrosive processing fluid of strong acid or strong alkali is used for carrying out the surface treatment, the processing fluid corrodes a liquid contacting surface of the pressure container. On this account, a corrosive chemical agent of strong acid or alkali cannot be introduced in the pressure container for carrying out the surface treatment. As a result, the range of selection of the processing fluid is notably reduced.

It may naturally be contemplated to apply an anti-corrosive coating such as of a fluorine resin to an inside surface of the pressure container for the purpose of eliminating the above limitation. However, it is actually impossible to ensure that the anti-corrosive coating continues to exhibit its function over an extended period of time under the high pressure condition. Even if the inside surface of the pressure container is coated with the anti-corrosive coating, it is impracticable to apply the anti-corrosive coating on the inside surfaces of all the associated components including thin piping extended to the pressure container, joints, high-pressure valves and the like.

SUMMARY OF THE INVENTION

A primary object of the invention is to provide a substrate processing method permitting a sequence of processes from the wet process to the drying process to be favorably performed without causing damages such as the fine pattern collapse to the substrate, and a substrate processing apparatus and a substrate processing system suited for the method.

Another object of the invention is to provide a substrate processing apparatus which is small and less expensive but has high versatility.

According a first aspect of the present invention, a wet processing step is performed in a wet processing apparatus or unit, and a drying step is performed in a high-pressure drying apparatus or unit. In the wet processing apparatus or unit, a substrate is subjected to a predetermined wet process by supplying thereto a processing solution and then supplying an anti-drying solution thereto whereby the processing solution adhered to the substrate is replaced with the anti-drying solution. The processed substrate is transported, as wetted with the anti-drying solution, to the high-pressure drying apparatus or unit. In the high-pressure drying apparatus or unit, the transported substrate is dried by the use of a high-pressure fluid or a mixture of the high-pressure fluid and a chemical agent, as a processing fluid.

According a second aspect of the present invention, a wet processing step performed in a wet processing apparatus or unit, a replacing step performed in a replacing apparatus or unit, and a drying step performed in a high-pressure drying apparatus or unit. In the wet processing apparatus or unit, a substrate is subjected to a predetermined wet process by supplying thereto a processing solution. The substrate is transported, as wetted with the processing solution, to the replacing apparatus or unit. In the replacing apparatus or unit, an anti-drying solution is supplied to the substrate thereby replacing the processing solution adhered to the substrate with the anti-drying solution. The substrate is transported, as wetted with the anti-drying solution, to the high-pressure drying apparatus or unit. In the high-pressure drying apparatus or unit, the transported substrate is dried by the use of a high-pressure fluid or a mixture of the high-pressure fluid and a chemical agent, as a processing fluid.

According a third aspect of the present invention, a substrate processing apparatus comprises: a plurality of developing units for performing different developing processes for a substrate, respectively; a high-pressure processing unit for allowing a high-pressure fluid or a mixture of the high-pressure fluid and a chemical agent, as a processing fluid, to contact a surface of the developed substrate thereby performing a predetermined surface treatment for the developed substrate; and a transport unit, capable of accessing the plural developing units and the high-pressure processing unit, for unloading the developed substrate from any one of the plural developing units and for loading the developed substrate into the high-pressure processing unit.

The high-pressure fluid used in the present invention is preferably carbon dioxide because of its safety, price and easiness of changing into a supercritical state. Other than carbon dioxide, water, ammonia, nitrogen monoxide, ethanol or the like may be used. The reasons why the high-pressure fluid is used are as follows. The high-pressure fluid has a high diffusion coefficient so that it is possible to disperse a dissolved contaminant into a medium. In addition, when the high-pressure fluid is changed into a supercritical fluid by bringing higher pressure thereon, it is possible to more penetrate even through fine patterns due to its property between gas and liquid. Further, density of the high-pressure fluid is close to that of liquid so that it is possible to contain a far larger amount of an additive (chemical agent) in comparison with gas.

The high-pressure fluid in the present invention is a fluid whose pressure is 1 MPa or more. The high-pressure fluid preferably used is a fluid which is known to possess high density, high solubility, low viscosity and high diffusion property, and further preferably used is a fluid which is in a supercritical or subcritical state. In order to bring carbon dioxide into a supercritical fluid, carbon dioxide may be at 31 degrees Celsius and of 7.1 MPa or more. It is preferable to use a subcritical fluid (high-pressure fluid) or supercritical fluid of 5 through 30 MPa at drying step, and it is further preferable to perform these processes under 7.1 through 20 MPa.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

First Embodiment

Figure 1:
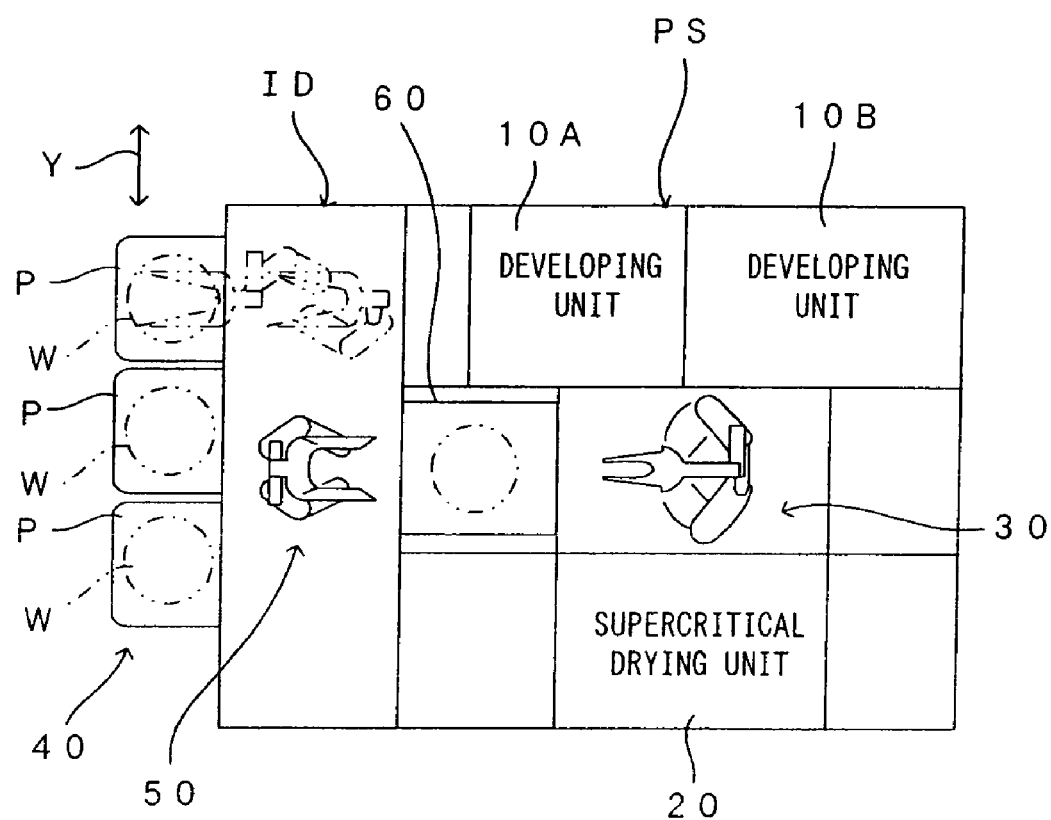
FIG. 1 is a diagram showing a substrate processing system according to a first embodiment of the present invention.
Figure 2:
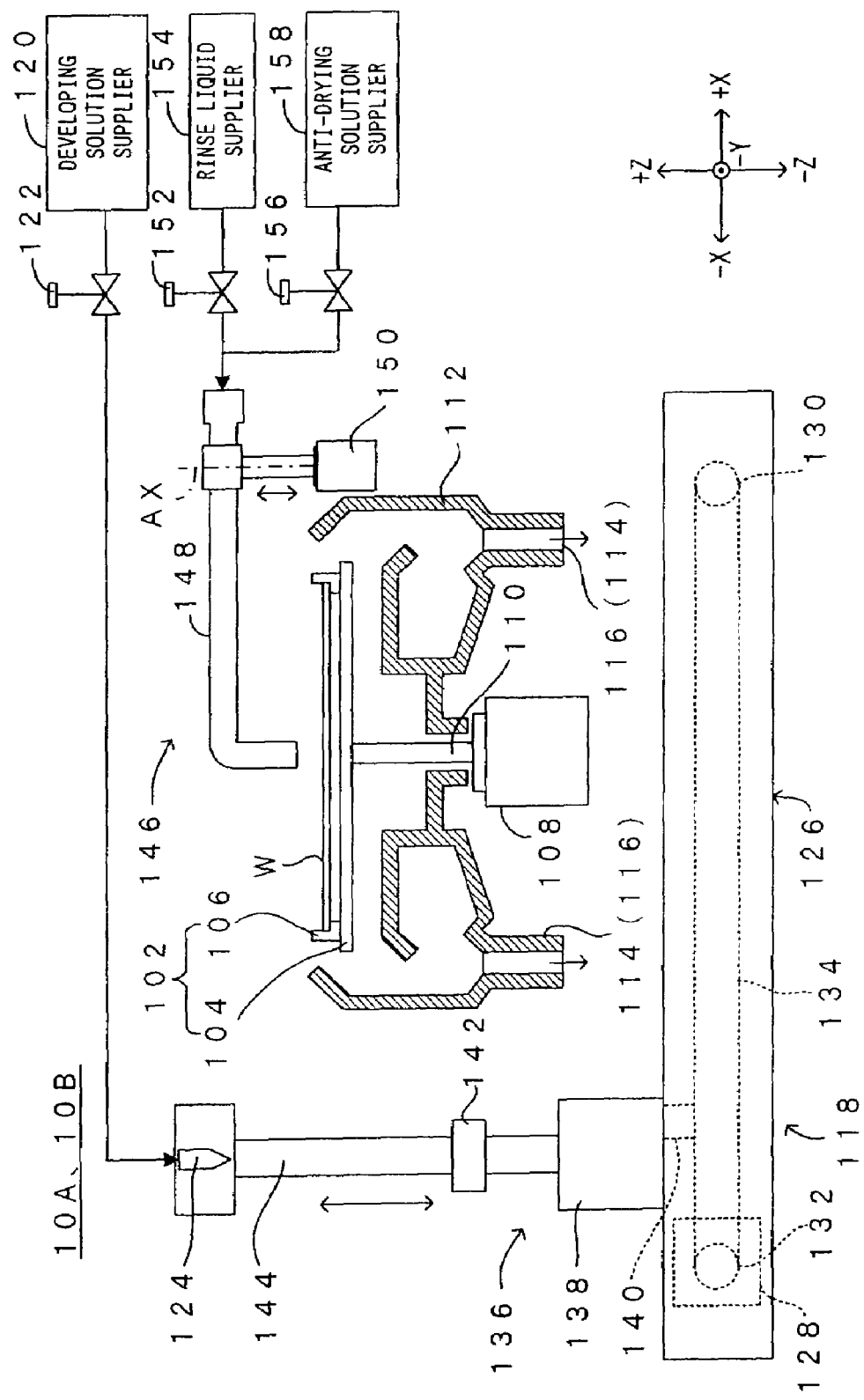
FIG. 2 is a diagram showing a developing unit installed in the substrate processing system of FIG. 1.
Figure 3:
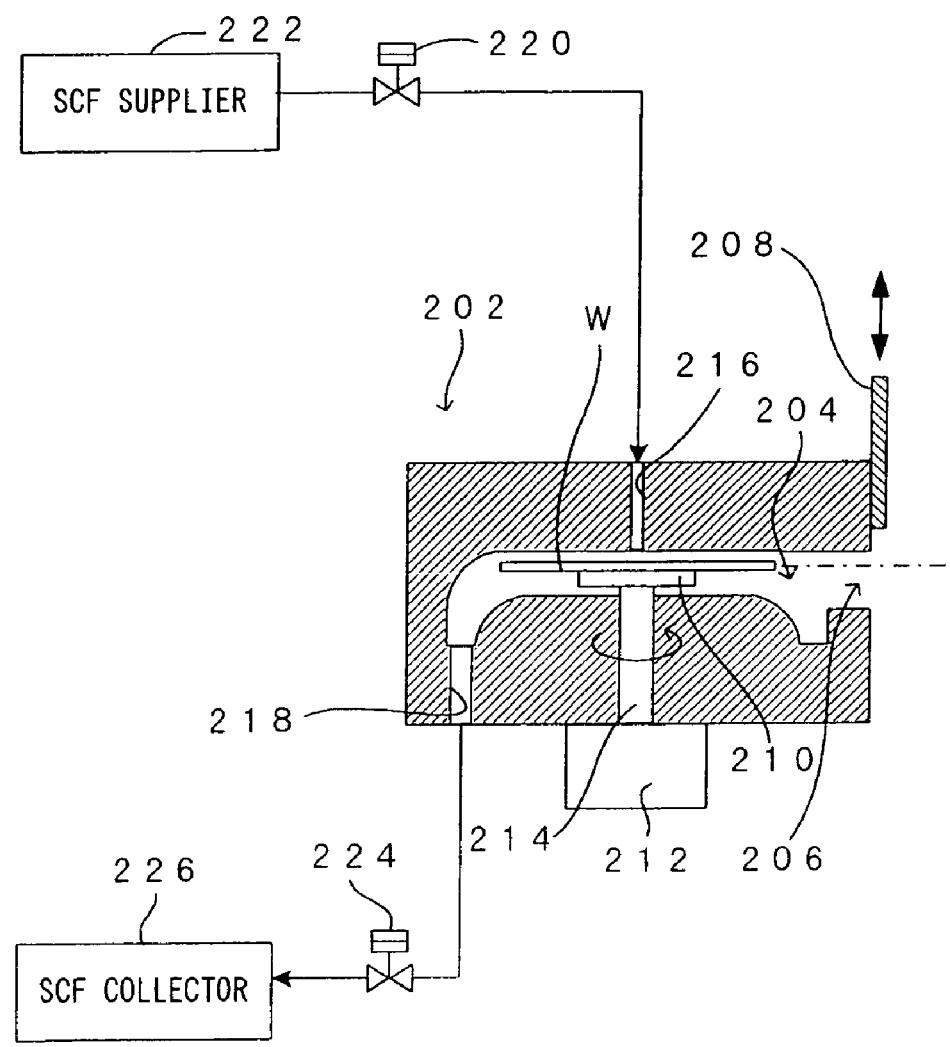
FIG. 3 is a diagram showing a high-pressure drying unit installed in the substrate processing system of FIG. 1.

FIG. 1 is a diagram showing a substrate processing system according to a first embodiment of the present invention. FIG. 2 is a diagram showing a developing unit installed in the substrate processing system of FIG. 1. FIG. 3 is a diagram showing a high-pressure drying unit installed in the substrate processing system of FIG. 1. As shown in FIG. 1, the substrate processing system includes a substrate processing section PS and an indexer ID connected with the substrate processing section PS.

The substrate processing section PS is provided with a plurality of developing units (two developing units 10A, 10B provided in this embodiment) which each performs the same wet process to a substrate. The developing units are defined as a "wet processing apparatus", a "substrate processing apparatus" or a "wet processing unit" of the present invention. Specifically, each of the developing units 10A, 10B supplies a developing solution, as a first processing fluid, to a surface of a substrate W for effecting a developing process and then, supplies a rinse liquid, as a second processing fluid, to the substrate surface for carrying out a rinsing process. Subsequently, the developing unit supplies an anti-drying solution to the substrate surface thereby replacing the rinse liquid adhered to the substrate W with the anti-drying solution. The construction and operation of the developing unit will be specifically described hereinlater.

There is further provided a supercritical drying unit 20, as a processing unit, which performs a supercritical drying process on the substrate W subjected to the wet-processing steps (including the developing process, rinsing process and replacing process according to this embodiment). The supercritical drying unit 20 functions as a "high-pressure drying unit" or a "high-pressure drying apparatus" of the present invention. The construction and operation of this unit will be specifically described hereinlater.

There is further provided a primary transport robot 30 substantially centrally of the substrate processing section PS in a manner to be surrounded by these processing units 10A, 10B, 20. The primary transport robot functions as a "transport unit" of the present invention.

According to the embodiment, the developing units 10A, 10B are essentially constructed the same way, as shown in FIG. 2. Specifically, the developing unit 10A, 10B each include a substrate retainer (substrate retaining means) 102 for retaining the substrate W. The substrate retainer 102 includes a substrate support plate 104 having substantially the same dimension in plan as that of the substrate W, and a plurality of circumferential support pins 106 secured to a top surface of the substrate support plate 104. The circumferential support pins 106 carry a circumferential portion of the substrate W thereby retaining the substrate W substantially in a horizontal position. As required, a central support pin may upstand from the top surface of the substrate support plate 104 for supporting the substrate W at the center of a lower surface thereof. While the embodiment mechanically retains the substrate W, the method for retaining the substrate is not limited to this. For instance, the substrate W may be retained by vacuum sucking the lower surface thereof.

The substrate support plate 104 is connected with an output rotary shaft 110 of a motor 108 so as to be rotated in conjunction with the operation of the motor 108. Thus, the substrate W retained by the substrate retainer 102 is driven into rotation in a desired timing.

The apparatus further is provided with a processor cup 112 around the substrate retaining portion 102 in order to recover a surplus of the developing solution, as well as the rinse liquid used in the rinsing process and the anti-drying solution (replacing solution) used in the replacing process. The developing solution is supplied to the substrate W via a slit nozzle 124 to be described hereinlater. On the other hand, the rinse liquid and the anti-drying solution are supplied via an ejection nozzle 148. The processor cup 112 is adapted to be raised or lowered and includes a drain port 114 (116) and an exhaust port 116 (114) at a bottom thereof.

The substrate processing system is provided with a developing solution supply mechanism 118 as "processing solution supply means" of the present invention for supplying the developing solution to the substrate W via the slit nozzle 124 as described above. The developing solution supply mechanism 118 pumps the developing solution from a developing solution supplier 120 to the slit nozzle 124 via a valve 122 and then, forms a developing solution layer by spreading the developing solution over the surface of the substrate W. Specifically, the slit nozzle 124 has a developing solution feed opening of a length equal to the diameter of the substrate W. The developing solution supply mechanism 118 drives a horizontal movement mechanism 126 to move the slit nozzle 124 in a (+X) direction in parallel with the substrate W while applying dropwise the developing solution onto the substrate W via the developing solution feed port, the substrate held in standstill. Thus is formed a puddle of developing solution on the overall surface of the substrate W. It is noted that the length of the developing solution feed port is not limited to the same as the diameter of the substrate W but may be greater than the diameter of the substrate. When forming the puddle of developing solution, an impact of the developing solution on the substrate W is taken into consideration. That is, the dropwise application of the developing solution is started just before the slit nozzle 124 is presented above the substrate W, whereas the slit nozzle 124 is moved in the (+X) direction.

The horizontal movement mechanism 126 for driving the slit nozzle 124 includes a motor 128, pulleys 130, 132 and a belt 134. A motor shaft of the motor 128 is coupled to the pulley 132, whereas the belt 134 is entrained about the pulleys 130, 132. That is, the belt 134 is arranged to run in cycles in conjunction with the rotation of the motor 128. The belt 134 and a servomotor 138 of an elevating mechanism 136 are interconnected via a lock member 140. In association with the normal or reversal rotation of the motor 128, therefore, the servo motor 138 is moved forward or backward along an X-axis direction so that the slit nozzle 124 disposed at an upper part of the elevating mechanism 136 is moved in the (+X) or (−X) direction.

On the other hand, the elevating mechanism 136 includes the servomotor 138, a coupling 142 and a ball screw 144. The rotation of the servomotor 138 is transmitted to the ball screw 144 via the coupling 142. The ball screw 144 is threadedly engaged with the slit nozzle 124 so that the slit nozzle 124 is vertically moved up or down in association with the normal or reversal rotation of the servomotor 138. The coupling 142 is a member serving to accommodate axial displacement between a motor shaft of the servomotor 138 and the ball screw 144 for protecting the servo motor 138.

While the developing solution supply mechanism 118 employs the slit nozzle 124 as a developing nozzle for ejecting the developing solution, the developing nozzle is not limited to this. The developing solution supply mechanism 118 may employ any other nozzle such as a straight nozzle, an SS nozzle, an SI nozzle and an MI nozzle. The embodiment scans the developing nozzle 124 in the X direction for supplying the developing solution to the substrate W. However, an alternative mechanism may be employed as the "processing solution supply means" of the present invention, which supplies the developing solution to a part of the substrate W via the developing nozzle 124 and then rotates the substrate W thereby coating the overall substrate surface with the developing solution.

According to the embodiment, a rinse/anti-drying solution supply mechanism 146 is provided for selectively supplying the rinse liquid or the anti-drying solution (replacing solution) to the substrate W. The rinse/anti-drying solution supply mechanism 146 is provided with the nozzle 148 at place above the substrate retainer 102 so as to be able to selectively eject the rinse liquid or the anti-drying solution toward the substrate W. As shown in FIG. 2, the ejection nozzle 148 has its proximal end connected with an elevating rotary mechanism 150 such that the ejection nozzle may be horizontally pivoted about a rotation center AX or moved up or down by the elevating rotary mechanism 150. A rear end of the ejection nozzle 148 is connected to a rinse liquid supplier 154 via a valve 152 as well as to an anti-drying solution supplier 158 via a valve 156. Thus, the ejection nozzle 148 is capable of selectively ejecting the rinse liquid or the anti-drying solution based on the open/close control of the valves 152, 156. According to the embodiment, the rinse/anti-drying solution supply mechanism 146 has double functions as the "processing solution supply means" of the present invention and as "anti-drying solution supply means" of the present invention, whereas the ejection nozzle 148 functions as a nozzle for ejecting the rinse liquid and the anti-drying solution. As a matter of course, an arrangement may be made such that an ejection nozzle dedicated to the rinse liquid and an ejection nozzle dedicated to the anti-drying solution are provided and that the individual nozzles are moved up or down or rotated by a respective elevating rotary mechanism, as required. An alternative arrangement may be made such that both the ejection nozzle for the rinse liquid and the ejection nozzle for the anti-drying solution are moved by means of a single elevating rotary mechanism.

In principle, any fluid may be used as the anti-drying solution so long as such a fluid can prevent the substrate W from becoming air-dry during the transportation of the substrate from the developing unit 10A, 10B to the supercritical drying unit 20. In the light of the efficiency of the supercritical drying process performed in the supercritical drying unit 20, however, a fluid having a good affinity with the SCF may preferably be used. The reason is because the use of a fluid having a higher affinity with the SCF than the rinse liquid permits the supercritical drying process to be performed more efficiently than the apparatus described in the Patent Document 1. In view of these, the replacing solution such as a fluorocarbon-base solution may be used as the anti-drying solution.

In the developing unit 10A, 10B of this construction, the valves 122, 152, 156 are so controlled as to supply the developing solution to the substrate W for effecting a predetermined developing process, to supply the rinse liquid to the substrate W thus developed thereby carrying out the rinsing process and then to supply the anti-drying solution to the substrate W thus rinsed thereby replacing the rinse liquid adhered to the substrate W with the anti-drying solution.

Next, a detailed description is made on the supercritical drying unit 20 with reference to FIG. 3. As seen in the figure, the supercritical drying unit 20 rotatably retains the substrate W in a processing chamber 204 of a pressure container 202. More specifically, the pressure container 202 has its interior defined as the processing chamber 204 and is laterally formed with an aperture 206 through which the substrate W is inserted in or taken out from the processing chamber 204.

Disposed near the pressure container 202 is a gate 208 for opening or closing the aperture 206. The gate 208 is coupled to a gate driver (not shown), which is operated according to an operation command from a control unit controlling the whole apparatus so as to move up or down the gate 208. When the gate 208 is moved down, for example, the aperture 206 is closed to establish an air-tight state in the processing chamber 204. When, on the other hand, the gate 208 is moved up by the gate driver, the aperture 206 is opened as shown in the figure, permitting the primary transport robot 30 to access the processing chamber 204 by moving its hand along a transport path indicated by a dot-dash line in the figure. Then, the hand holding the substrate W wet with the anti-drying solution is moved into the processing chamber 204 to place the substrate W on a spin chuck 210 located within the processing chamber 204 (load of the substrate W). Conversely, the hand picks up the substrate W from the spin chuck 210 and then is retreated from the pressure container 202 along the transport path, thereby unloading the substrate W from the pressure container 202.

The spin chuck 210 is disposed within the processing chamber 204. The spin chuck is capable of retaining the substrate W by sucking a central portion of the lower surface of the substrate W via a suction port (not shown) provided in a top surface thereof. The spin chuck 210 is coupled to a rotary shaft 214 rotated by a motor 212. In conjunction with the rotation of the motor 212 responding to an operation command from the control unit, the spin chuck 210 and the substrate W retained thereon are integrally rotated in the processing chamber 204. The method of retaining the substrate W by means of the spin chuck 210 is not limited to suction. An arrangement for mechanically retaining the substrate is also possible.

As shown in the figure, the pressure container 202 is formed with two through-holes 216, 218 communicated with the processing chamber 204. Of these through-holes, the through-hole 216 on a ceiling side is disposed in a manner to present its end on the processing chamber 204 side to a center of an upper surface of the substrate W retained on the spin chuck 210. On the other hand, the other end of the through-hole 216 is connected to an SCF supplier 222 via a valve 220. Thus, the valve 220 may be opened based on an open command from the control unit for supplying supercritical carbon dioxide, as a processing fluid, from the SCF supplier 222 to the processing chamber 204 whereby the supercritical drying can be carried out.

While the embodiment uses the SCF of supercritical carbon dioxide as the processing fluid, a mixture of supercritical carbon dioxide and a chemical agent, as the processing fluid, may also be introduced into the processing chamber 204. A compatibilizer capable of serving as an auxiliary for dissolving or homogeneously dispersing the component of the anti-drying solution in the SCF may preferably be used as the chemical agent suitable for the drying process. The embodiment does not particularly limit the chemical agent so long as such an agent can compatibilize the component of the anti-drying solution with the SCF. Examples of a preferred compatibilizer include alcohols such as methanol, ethanol and isopropanol, and alkyl sulfoxides such as dimethyl sulfoxide generally called a surfactant.

The other through-hole 218 is connected to an SCF collector 226 via a valve 224, such that the SCF introduced in the processing chamber 204 in the aforementioned manner and contaminants produced in the supercritical drying process may be discharged from the pressure container 202.

Now referring to FIGS. 1 and 4, the primary transport robot 30 will be described. The primary transport robot 30 is adapted to load/unload the substrate W into/from the indexer ID and to access the processing units 10A, 10B, 20 to load/unload the substrate W into/from the processing units.

The indexer ID includes a substrate station 40 on which the substrate W is placed as accommodated in a pod P which is a covered container of a rectangular shape, and an indexer robot 50 capable of inserting/taking out the substrate W in/from the pod P placed on the substrate station 40 and of handing over/receiving the substrate W to/from the primary transport robot 30. A plural number (3 in this embodiment) of pods P can be placed on the substrate station 40 as arranged along a Y direction. Each pod P accommodates therein a cassette (not shown) capable of receiving a plurality of substrates W in stacked relation. The pod P is provided with a removable cover at a front side of the outside surfaces thereof, the front side confronted by the indexer robot 50. The cover is automatically attached to or removed from the pod by an unillustrated cover-removing mechanism.

The indexer robot 50 is adapted to travel along the direction in which the pods P are arranged on the substrate station 40, or the Y direction. Thus, the indexer robot moves to place in front of any one of the pods or to place in front of a hand-over portion 60 at which the substrate W is handed over to or received from the primary transport robot 30.

Figure 4:
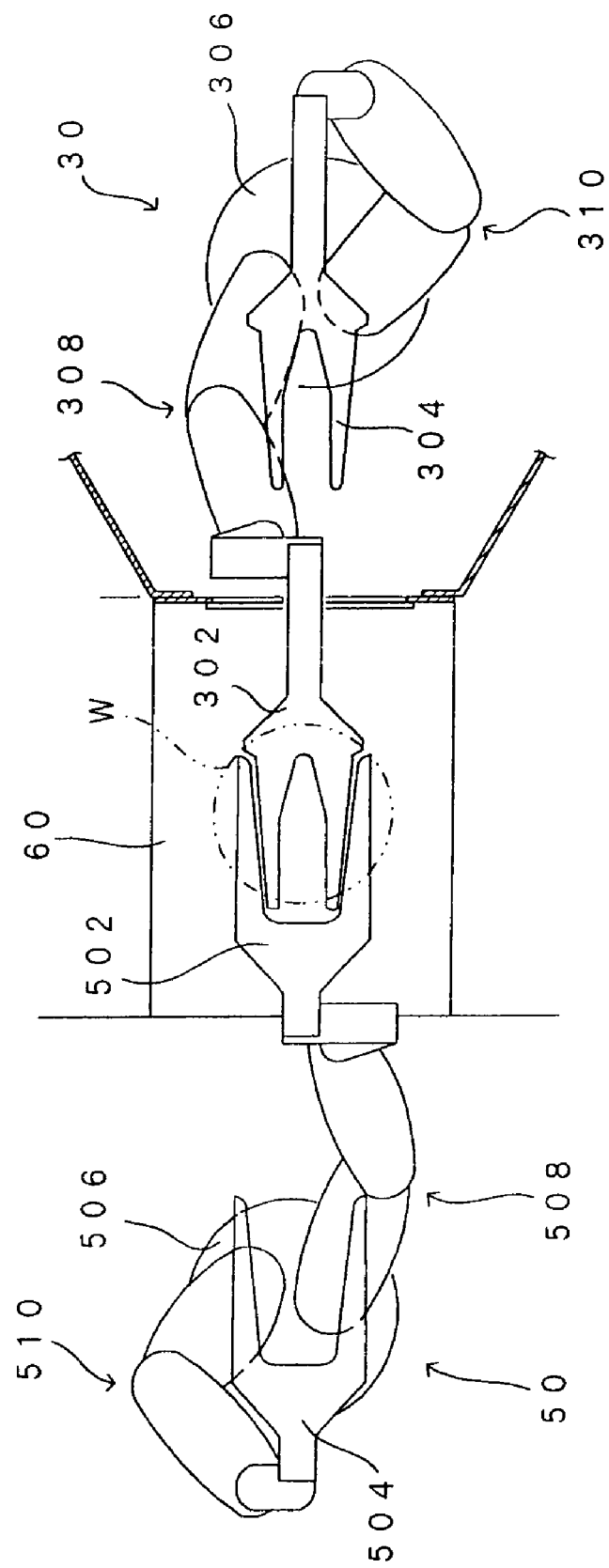
FIG. 4 is an enlarged plan view showing how a substrate is handed over between an indexer robot and a primary transport robot.

FIG. 4 is an enlarged plan view showing how the substrate W is handed over between the indexer robot and the primary transport robot. The primary transport robot 30 includes a pair of hands 302, 304 for holding the substrate W; forward/backward drive mechanisms 308, 310 each independently moving forward or backward a respective one of the hand pair 302, 304 relative to a base 306; a rotation drive mechanism (not shown) for drivingly rotate the base 306 about the vertical axis (the axis perpendicular to the drawing surface); and a vertical drive mechanism (not shown) for vertically moving up or down the base 306. The forward/backward drive mechanisms 308, 310 are of an articulated arm type and operative to horizontally move the hands 302, 304 forward or backward as retaining the hands 302, 304 in positions, respectively. The hand 302 on one side is designed to be moved forward or backward at a higher level than the other hand 304. In an initial state where both the hands 302, 304 are retreated to places above the base 306, these hands 302, 304 are vertically aligned with each other.

On the other hand, the indexer robot 50 includes a pair of hands 502, 504 for holding the substrate W; forward/backward drive mechanisms 508, 510 each independently moving forward or backward a respective one of the hand pair 502, 504 relative to a base 506; a rotation drive mechanism (not shown) for drivingly rotate the base 506 about the vertical axis; a vertical drive mechanism (not shown) for vertically moving up or down the base 506; and a horizontal drive mechanism for horizontally moving the whole body of the indexer robot 50 along the Y direction (see FIG. 4). The forward/backward drive mechanisms 508, 510 are of an articulated arm type and operative to horizontally move the hands 502, 504 forward or backward as retaining the hands 502, 504 in positions, respectively. The hand 502 on one side is positioned at a higher level than the other hand 504. In an initial state where both the hands 502, 504 are retreated to places above the base 506, these hands 502, 504 are vertically aligned with each other.

The hands 502, 504 of the indexer robot 50 and the hands 302, 304 of the primary transport robot 30 are all shaped like a fork. The hands 502, 504 of the indexer robot are substantially in the same shape, whereas the hands 302, 304 of the primary transport robot 30 are substantially in the same shape. The hands 502, 504 of the indexer robot 50 and the hands 302, 304 of the primary transport robot 30 are so shaped as to be substantially meshed with each other as seen in plan so that the substrate W can be directly handed over between the hands 502, 302 or between the hands 504, 304. At the hand-over portion 60, the hand 502 of the indexer robot 50 can receive the substrate W directly from the hand 302 of the primary transport robot 30. Likewise, the hand 504 of the indexer robot 50 can hand over the substrate W directly to the hand of the primary transport robot 30 at the hand-over portion 60.

Figure 5:
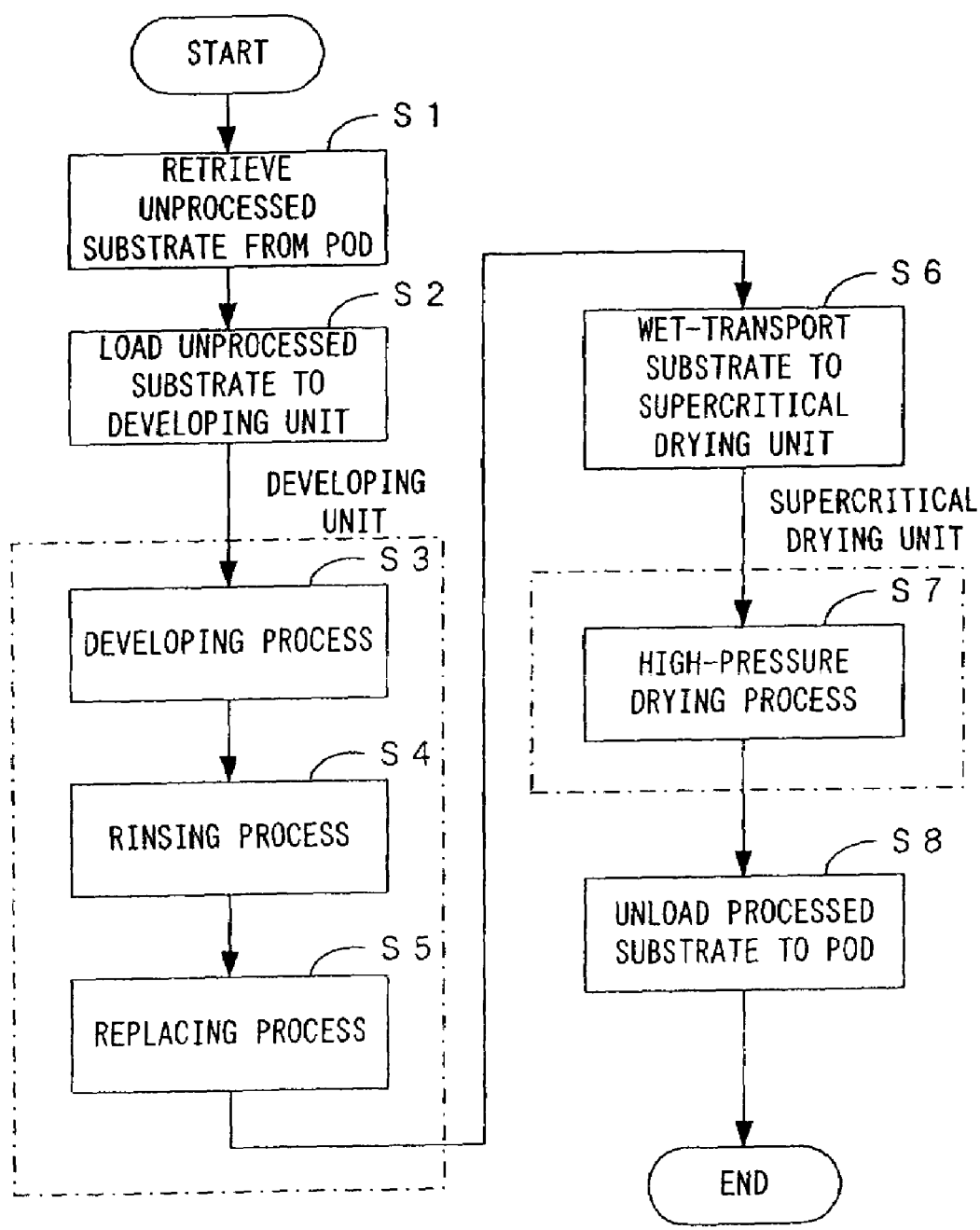
FIG. 5 is a flow chart representing the steps of operations of the substrate processing system of FIG. 1.

Next, the operations of the substrate processing system of the above construction will be specifically described with reference to FIG. 5. FIG. 5 is a flow chart representing the steps of operations of the substrate processing system of FIG. 1. It is noted here that the description of the operations of the individual parts of the system focuses on a single substrate W in order to facilitate the comprehension of the operations.

An unprocessed substrate W accommodated in the pod P placed on the substrate station 40 is retrieved by the indexer robot 50 (Step S1) and then, is directly handed over to the primary transport robot 30 at the hand-over portion 60. Thus, the unprocessed substrate W is loaded in the substrate processing section PS. So receiving the unprocessed substrate W, the primary transport robot 30 moves to place in front of either one of the developing units 10A, 10B so as to deliver the substrate W to the developing unit of interest (Step S2). In the developing unit 10A or 10B, the substrate W is subjected to the developing process, rinsing process and replacing process in this order (Steps S3 to S5). Subsequently, the substrate W as wetted with the anti-drying solution is wet-transported to the supercritical drying unit 20 by means of the primary transport robot 30 (Step S6). That is, the substrate W wet with the common anti-drying solution is held by the hand 302 (or 304) which, in turn, discharges the substrate from the developing unit. Then, the hand 302 (or 304) is moved to the processing chamber 204 to place the wet substrate on the spin chuck 210 (delivery of the substrate W). Thereafter, the hand 302 (or 304), which is now empty, is moved along the transport path in the reverse direction to that of the delivery of the substrate so as to be returned to a robot body (not shown). During this process, the gate 208 is in a raised position so that the aperture 206 is in an open state.

When the wet-transport of the substrate W is completed, the gate driver is operated to lower the gate 208. Thus, the aperture 206 is closed to bring the processing chamber 204 into an air-tight state. Then, the SCF introduction into the processing chamber 204 and the SCF recovery therefrom are performed for carrying out the high-pressure drying process (supercritical drying process) (Step S7). Here, the pressure in the processing chamber 204 is gradually increased while the motor 212 is operated to rotate the spin chuck 210 and the substrate W retained thereon at a relatively low rotational speed. The substrate W is prevented from becoming partially dry by rotating the substrate W in this manner and thus is ensured that the substrate is uniformly dried. The pressure and temperature in the processing chamber 204 are maintained at predetermined values by supplying the SCF from the SCF supplier 222 to the processing chamber 204 while recovering the SCF into the SCF collector 226. Thereafter, the SCF introduction is suspended and the SCF is recovered from the processing chamber 204 into the SCF collector 226, whereby the pressure in the processing chamber 204 is reduced for allowing the substrate W to dry. Alternatively, the supercritical drying may be accomplished by containing the SCF in the processing chamber 204, followed by suspending the SCF introduction and recovering the SCF from the processing chamber 204 into the SCF collector 226, as described above.

At completion of the sequential operations from the developing process to the high-pressure drying process, the rotation of the spin chuck 210 is stopped and the pressure in the processing chamber 204 is reduced to the atmospheric pressure. Subsequently, the gate 208 is raised to produce a state to permit the unload of the substrate W. Then, a transport command is given to the primary transport robot 30 to transport the substrate. Receiving the transport command, the primary transport robot 30 picks up the substrate W from the spin chuck 210 so as to unload the processed substrate W from the supercritical drying unit 20. Subsequently, the robot performs a procedure reversed from that taken for loading the substrate, or an unloading operation so as to insert the processed substrate W in the pod P placed on the substrate station 40 (Step S8).

According to the embodiment as described above, the developing process is performed in the developing unit 10A, 10B whereas the high-pressure drying process is performed in the supercritical drying unit 20 in a dedicated manner. Therefore, the sequential processes from the developing process to the high-pressure drying process can be favorably performed without limiting the type of a usable developing solution for the developing process or without producing the problem such as the corrosion in the pressure container 202 of the supercritical drying unit 20.

The foregoing description on the operations of the individual parts of the system puts the focus on a single substrate W. In the practical substrate processing system, however, plural substrates W are processed in parallel. That is, while one substrate W is subjected to the wet processes (Steps S3 to S5) in the developing unit (10A or 10B), another substrate W is subjected to the high-pressure drying process (Step S7) in the supercritical drying unit 20. According to the embodiment, therefore, the wet processes and the high-pressure drying process are performed in parallel so that the sequential processes from the developing process to the high-pressure drying process can be accomplished in a shorter time. Hence, the substrate may be processed efficiently.

In the developing unit 10A, 10B, the anti-drying solution is supplied to the substrate W thus developed and rinsed thereby replacing the rinse liquid adhered to the substrate W with the anti-drying solution. Subsequently, the substrate W, as wetted with the anti-drying solution, is wet-transported from the developing unit 10A, 10B to the supercritical drying unit 20. This is effective to prevent the substrate W from becoming air-dry during the transportation thereof. Hence, the substrate processing may preferably be carried out without causing damage to the substrate W.

Second Embodiment

Figure 6:
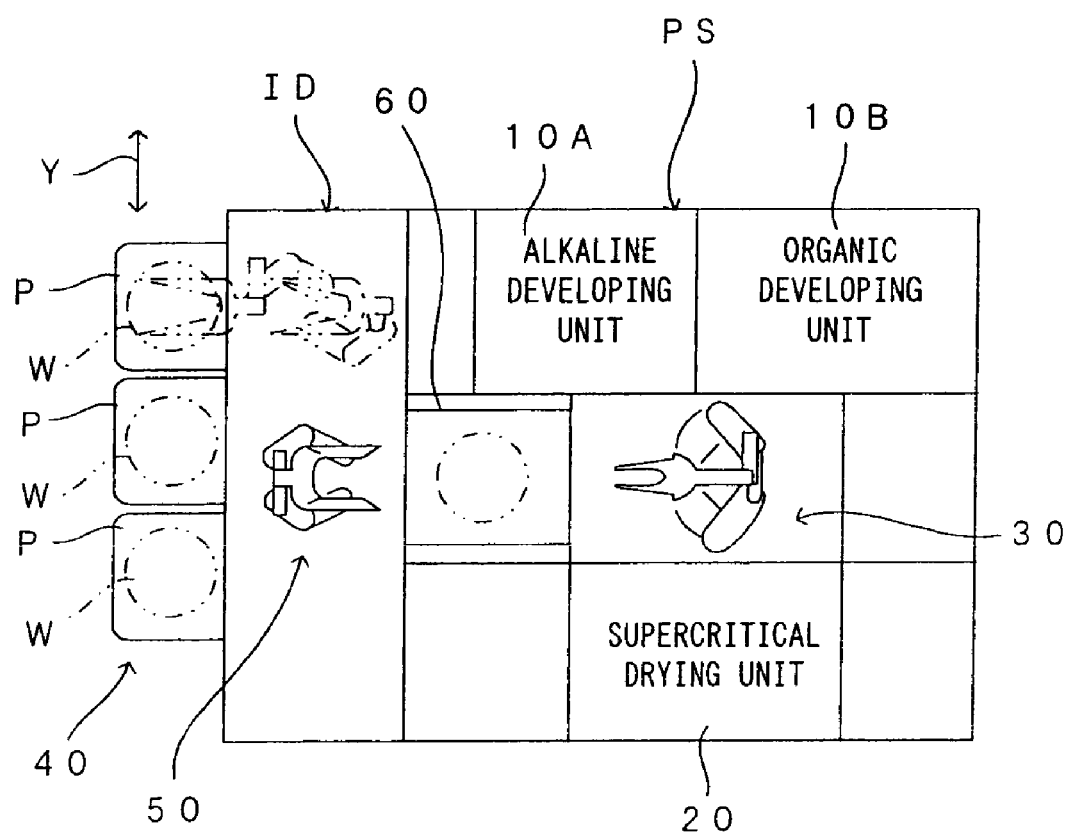
FIG. 6 is a diagram showing a substrate processing system according to a second embodiment of the present invention.

FIG. 6 is a diagram showing a substrate processing system according to a second embodiment of the present invention. In the second embodiment, a major difference from the first embodiment is as follows. That is, the developing units 10A, 10B in the substrate processing section PS according to the first embodiment perform the same wet processes on the substrate, whereas the developing units according to the second embodiment perform different developing processes, respectively. The developing units 10A, 10B are essentially constructed the same way as those of the first embodiment. However, these developing units use different developing solutions and rinse liquids, respectively. Hereinafter, therefore, the same components will be represented by the same reference characters, respectively, the description of which will be dispensed with. The following description will be made focusing on the difference.

Although both the developing units 10A, 10B are supplied with a common replacing solution from the anti-drying solution supplier 158, the developing units are supplied with different developing solutions or different rinse liquids, respectively. Specifically, the developing unit 10A is supplied with an aqueous alkaline solution, as the developing solution, from a developing solution supplier 120 and with pure water, as the rinse liquid, from a rinse liquid supplier 154. On the other had, the developing unit 10B is supplied with an organic developing solution such as butyl acetate, as the developing solution, from a developing solution supplier 120 and with IPA, as the rinse liquid, from a rinse liquid supplier 154. As the common replacing solution supplied from the anti-drying solution supplier 158, there is used a chemical solution exhibiting good affinity with supercritical carbon dioxide under low inert vapor pressure. Such a chemical solution is, for example, a fluorocarbon-base solution such as of perfluorocarbon having a hydrophilic terminal; or a perfluoropolyether containing an ammonium carboxyl group. A solution, containing a hydrophobic group and admixed with a surfactant for enhancing replaceability with pure water, may be used as the common replacing solution. That is, the developing units 10A, 10B perform the respective developing processes in the following manners.

The developing unit 10A performs the following processes in the order named.
(a) Alkaline developing process: supplying an aqueous alkaline solution, as the developing solution, to the substrate for removing unwanted resist;
(b) Rinsing process: supplying pure water, as the rinse liquid, to the substrate for removing the aqueous alkaline solution from the substrate thereby terminating the alkaline developing process; and
(c) Replacing process: supplying a common replacing solution to the substrate for replacing the pure water (the rinse liquid) adhered to the substrate with the common replacing solution.

These sequential processes (a)-(c) are equivalent to a "developing process" of the present invention.

On the other hand, the developing unit 10B performs the following processes in the order named.
(aa) Organic developing process: supplying an organic developing solution, as the developing solution, to the substrate for removing unwanted resist;
(bb) Rinsing process: supplying IPA, as the rinse liquid, to the substrate for removing the organic developing solution from the substrate thereby terminating the organic developing process; and
(cc) Replacing process: supplying the same common replacing solution as that used in the above replacing process (c) to the substrate for replacing IPA (the rinse liquid) adhered to the substrate with the common replacing solution.

These sequential processes (aa)-(cc) are equivalent to the "developing process" of the present invention.

Thus, the embodiment is arranged such that the primary transport robot 30 is adapted to select a destination (the developing unit 10A, 10B) to load the substrate W according to the type of the substrate W or more specifically, according to a resist film forming material, whereby a proper one of the alkaline developing process and the organic developing process may be carried out selectively. After subjected to the proper developing process in this manner, the substrate W is transported by the primary transport robot 30 to the supercritical drying unit 20 wherein the substrate is subjected to the supercritical drying process.

Figure 7:
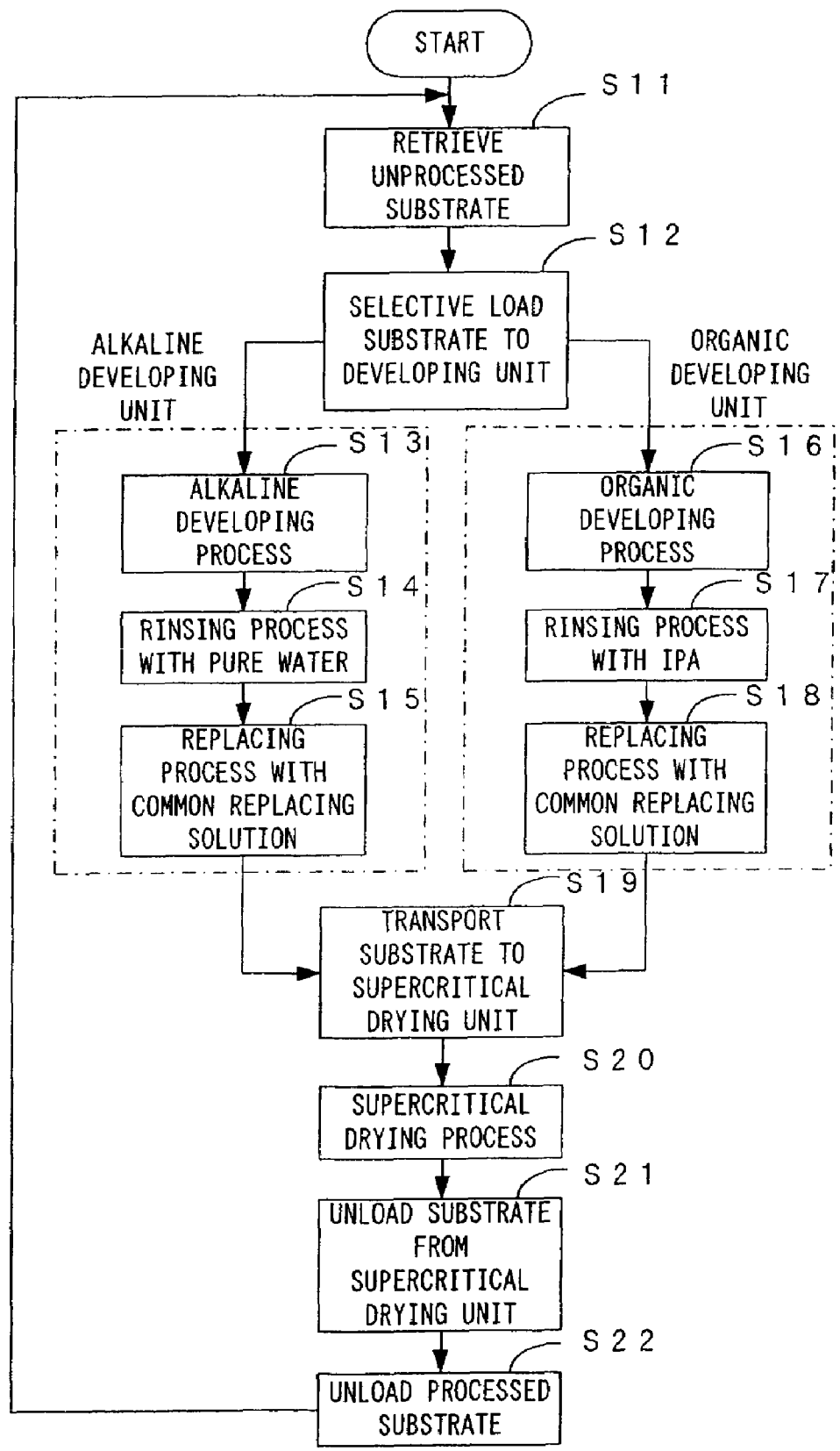
FIG. 7 is a flow chart representing the steps of operations of the substrate processing system of FIG. 6.

Next, the operations of the substrate processing system of FIG. 6 will be described in details with reference to FIG. 7. FIG. 7 is a flow chart representing the steps of operations of the substrate processing system of FIG. 6. It is noted here that the description of the operations of the individual parts of the system focuses on a single substrate W in order to facilitate the comprehension of the operations.

An unprocessed substrate W accommodated in the pod P placed on the substrate station 40 is retrieved by the indexer robot 50 and then, is directly handed over to the primary transport robot 30 at the hand-over portion 60. Thus, the unprocessed substrate W is loaded in the substrate processing section PS (Step S11). Receiving the unprocessed substrate W, the primary transport robot 30 transports the substrate W to a developing unit corresponding to a film material forming a resist film on the substrate W (Step S12). Specifically, where the substrate W is to be subjected to the alkaline developing process, the primary transport robot 30 loads the substrate W to the alkaline developing unit 10A.

Where, on the other hand, the substrate W is to be subjected to the organic developing process, the primary transport robot 30 loads the substrate W to the organic developing unit 10B.

When the substrate W is delivered to the alkaline developing unit 10A, the developing unit 10A performs the alkaline developing process (Step S13), the rinsing process with pure water (Step S14) and the replacing process with the common replacing solution (Step S15) in this order. When, on the other hand, the substrate W is delivered to the organic developing unit 10B, the developing unit 10B performs the organic developing process (Step S16), the rinsing process with IPA (Step S17), and the replacing process with the common replacing solution (Step S18) in this order. In this manner, the developing units 10A, 10B perform different developing processes, respectively. However, both the developing units 10A, 10B perform the replacing process as a final process using the common replacing solution, so that the substrate W is wetted with the common replacing solution.

At completion of the developing process, the primary transport robot 30 wet-transports the developed substrate W to the supercritical drying unit 20 without determining which of the developing units 10A, 10B has developed the substrate (Step S19). Specifically, the substrate W wet with the common replacing solution is held by the hand 302 (or 304) which, in turn, unloads the substrate from the developing unit. Then, the hand 302 (or 304) holding the wet substrate is moved to the processing chamber 204 to place the substrate on the spin chuck 210 (delivery of the substrate W). Thereafter, the hand 302 (or 304), which is now empty, is moved along the transport path in the reverse direction to that of the delivery of the substrate so as to be returned to the robot body (not shown). During this process, the gate 208 is in the raised position so that the aperture 206 is in the open state.

When the wet-transport of the substrate W is completed, the gate driver is operated to lower the gate 208. Thus, the aperture 206 is closed to bring the processing chamber 204 into the air-tight state. Then, the SCF introduction into the processing chamber 204 and the SCF recovery therefrom are performed for carrying out the supercritical drying process (Step S20). Here, the pressure in the processing chamber 204 is gradually increased while the motor 212 is operated to rotate the spin chuck 210 and the substrate W retained thereon at a relatively low rotational speed. The substrate W is prevented from becoming partially dry by rotating the substrate in this manner and thus is ensured that the substrate is uniformly dried. The pressure and temperature in the processing chamber 204 are maintained at predetermined values by supplying the SCF from the SCF supplier 222 to the processing chamber 204 while recovering the SCF in the SCF collector 226. Thereafter, the SCF introduction is suspended and the SCF is recovered from the processing chamber 204 into the SCF collector 226, whereby the pressure in the processing chamber 204 is reduced for allowing the substrate W to dry. Alternatively, the supercritical drying may be accomplished by containing the SCF in the processing chamber 204, followed by suspending the SCF introduction and recovering the SCF from the processing chamber 204 into the SCF collector 226, as described above.

At completion of the sequential operations from the developing process to the drying process, the rotation of the spin chuck 210 is stopped and the pressure in the processing chamber 204 is reduced to the atmospheric pressure. Subsequently, the gate 208 is raised to produce the state to permit the discharge of the substrate W. Then, a transport command is given to the primary transport robot 30 to transport the substrate. Receiving the transport command, the primary transport robot 30 picks up the substrate W from the spin chuck 210 and unloads the processed substrate W from the supercritical drying unit 20 (Step S21). Subsequently, the robot performs a procedure reversed from that taken for loading the substrate, or the unloading operation so as to insert the processed substrate W in the pod P placed on the substrate station 40 (Step S22).

According to the embodiment as described above, the alkaline developing unit 10A and the organic developing unit 10B are installed in the same system so that, as shown in FIG. 7, either one of the two developing processes may be selectively performed on each substrate W Hence, the substrate processing system has high versatility. Furthermore, the arrangement is made such that the substrate W developed by either of the developing units 10A, 10B is transported to the supercritical drying unit 20 by the primary transport robot 30 which does not determine which of the developing units 10A, 10B has developed the substrate. Thus, the primary transport robot 30 functions as a common transport unit. Hence, the system has a more simplified construction and is reduced in the size and cost, as compared with a case where dedicated transport units are provided in correspondence to the contents of the developing processes.

Since the developed substrate W is wet-transported from the developing unit 10A, 10B to the supercritical drying unit 20, the substrate W is prevented from becoming air-dry during the transportation thereof. This is effective to protect the surface of the substrate or particularly to prevent the collapse of the fine pattern.

In addition, the developing units 10A, 10B perform the final processing of the developing process to replace the rinse liquid (the liquid component) adhered to the substrate W with the common replacing solution and hence, the following working effect can be attained. Although the developing units 10A, 10B use the different developing solutions (e.g., aqueous alkaline solution, organic developing solution), respectively, the liquid component finally adhered to the substrate W is that of the common replacing solution. Therefore, when unloading the developed substrate W, the primary transport robot 30 need not consider which of the developing units 10A, 10B has developed the substrate and may proceed to the transportation of the substrate.

Third Embodiment

Figure 8:
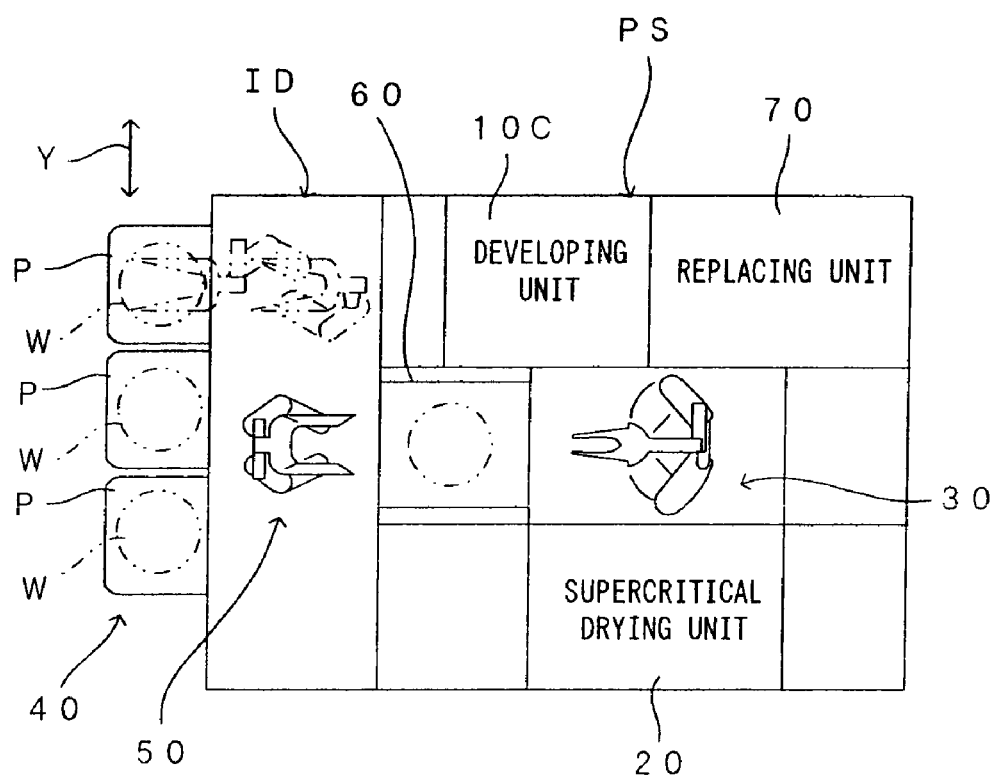
FIG. 8 is a diagram showing a substrate processing system according to a third embodiment of the present invention.
Figure 9:
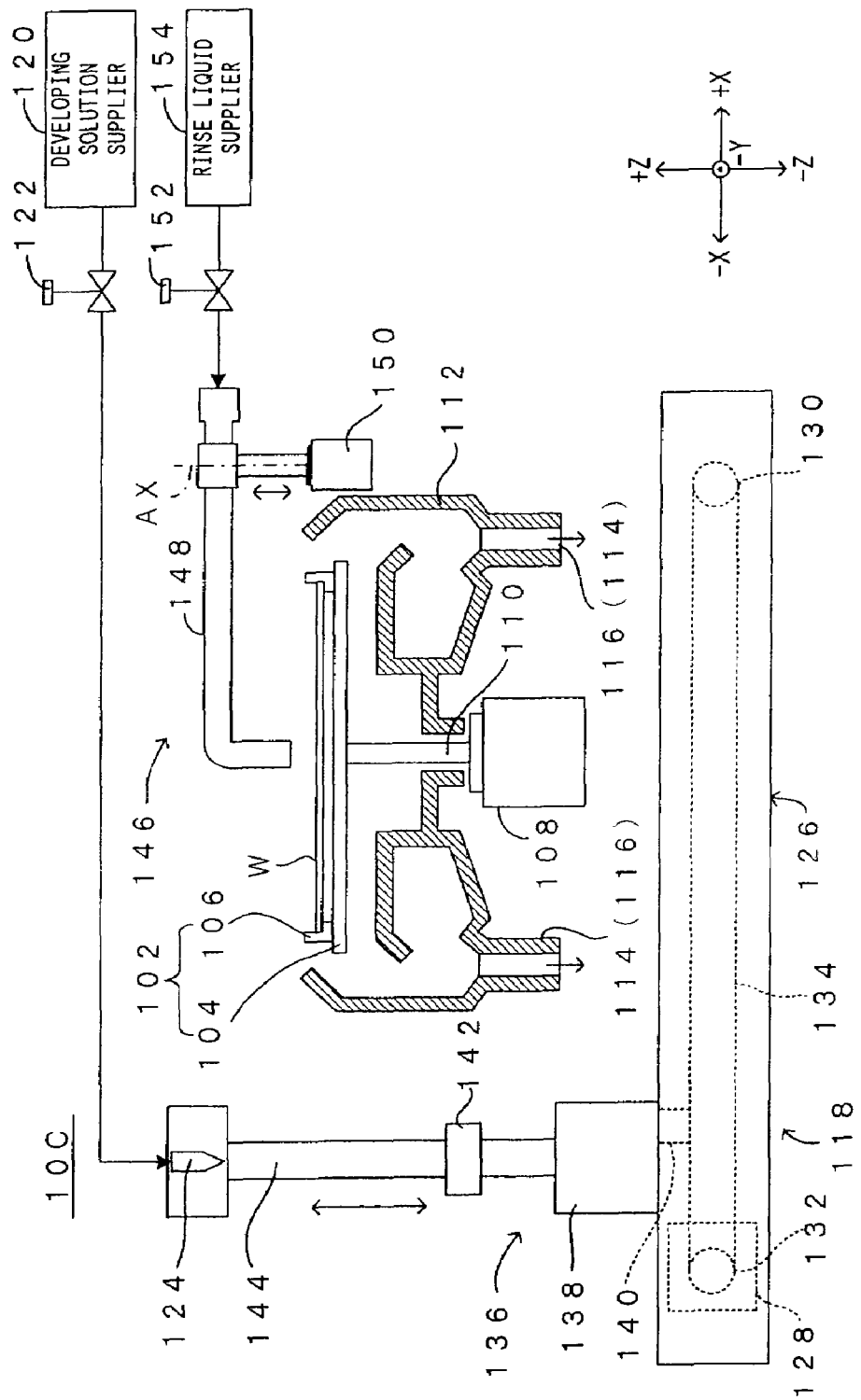
FIG. 9 is a diagram showing a developing unit installed in the substrate processing system of FIG. 8.
Figure 10:
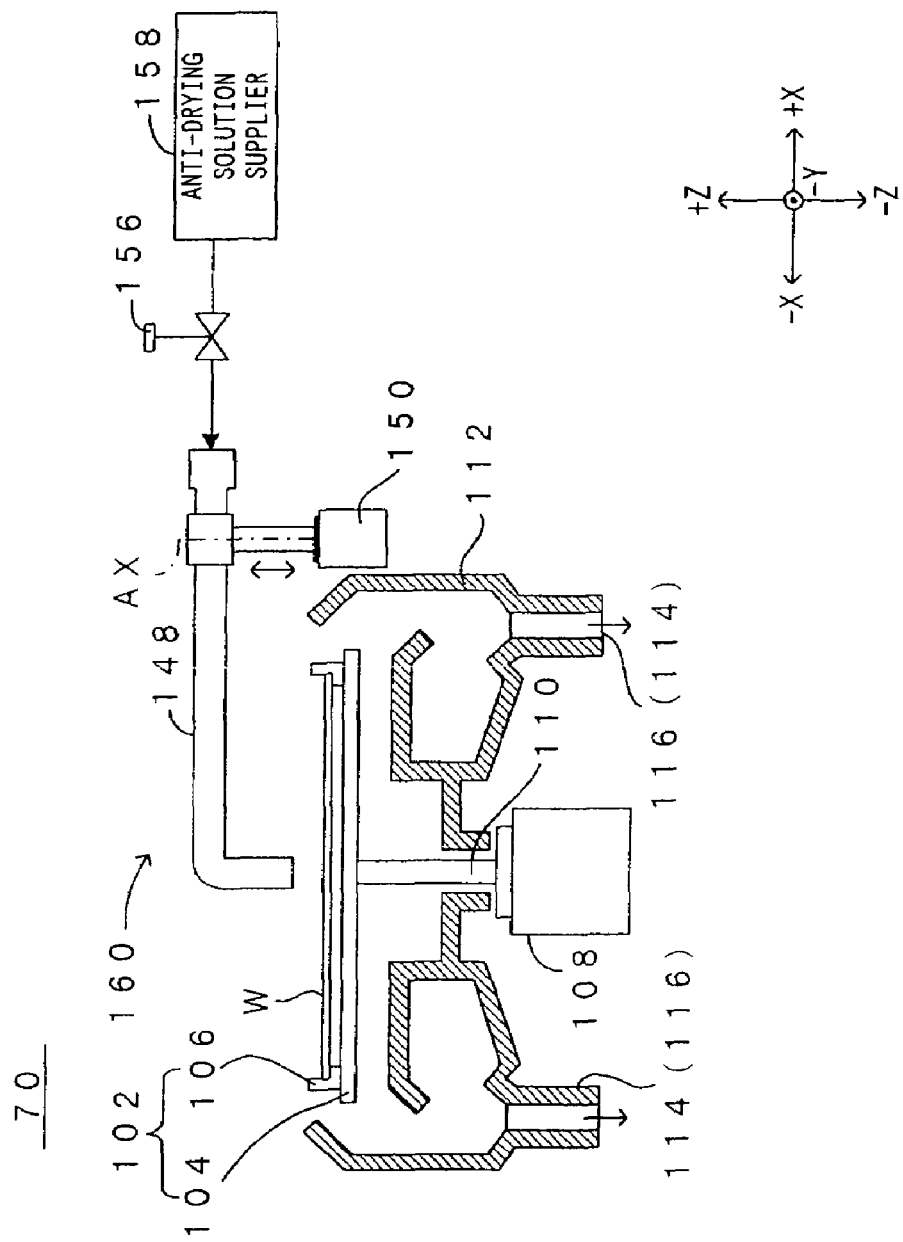
FIG. 10 is a diagram showing a replacing unit installed in the substrate processing system of FIG. 8.

FIG. 8 is a diagram showing a substrate processing system according to a third embodiment of the present invention, whereas FIG. 9 is a diagram showing a developing unit installed in the substrate processing system of FIG. 8. FIG. 10 is a diagram showing a replacing unit installed in the substrate processing system of FIG. 8. In the third embodiment, a major difference from the first embodiment is as follows. That is, the developing process, rinsing process and replacing process are performed in the same developing unit 10A or 10B according to the first embodiment, whereas the third embodiment is arranged such that the developing process and rinsing process are performed in a developing unit 10C and the replacing process is performed in a dedicated replacing unit 70. Furthermore, the primary transport robot 30 wet-transports a substrate W from the developing unit 10C to the supercritical drying unit 20 via the replacing unit 70. The other features are essentially the same as those of the first embodiment. Hereinafter, therefore, the same components will be represented by the same reference characters, respectively, the description of which will be dispensed with. The following description will focus on the difference.

The developing unit 10C is constructed the same way as the developing units 10A, 10B of the first embodiment, except that the unit 10C does not have a structure equivalent to the anti-drying solution supply means for supplying the anti-drying solution to the substrate W. With the substrate W retained on the substrate retainer 102, the substrate processing apparatus 10C pumps the developing solution from the developing solution supplier 120 to the slit nozzle 124 via the valve 122 and then, allows the developing solution to spread over the surface of the substrate W to form a developing solution layer thereover for effecting the developing process. After the developing process, the apparatus ejects the rinse liquid from the ejection nozzle 148 for carrying out the rinsing process. Thus, the developing unit 10C functions as a "wet-processing apparatus" and "wet-processing unit" of the present invention. Since the other features and operations of the developing unit 10C are the same as those of the developing units 10A, 10B of the first embodiment, such features are represented by the same reference characters, respectively, the description of which will be dispensed with. All types of the conventionally known developing apparatuses may be used as the developing unit 10C. That is, the known developing apparatuses supply the developing solution to the substrate for effecting the developing process and thereafter, supply the rinse liquid to the substrate for performing the rinsing process.

As shown in FIG. 10, the replacing unit 70 is provided with the substrate retainer (substrate retaining means) 102 for retaining the substrate W. The substrate retainer 102 has the same construction as that of the developing units 10A to 10C and is capable of retaining the substrate W substantially in a horizontal position by carrying a circumferential portion of the substrate W on a plurality of circumferential support pins 106 secured to the top surface of the substrate support plate 104. Incidentally, the method for retaining the substrate is not limited to this but may be adopted arbitrarily. As required, a central support pin may upstand from the top surface of the substrate support plate 104 for supporting a center of the lower surface of the substrate W. Otherwise, the substrate W may be retained by way of vacuum suction of the lower side thereof.

The unit is further provided with an anti-drying solution supply mechanism (anti-drying solution supply means) 160 for supplying the anti-drying solution (replacing solution) to the substrate W. The anti-drying solution supply mechanism 160 includes the nozzle 148 located above the substrate retainer 102, thus adapted to eject the anti-drying solution toward the substrate W. As shown in the figure, the proximal end of the ejection nozzle 148 is connected with the elevating rotary mechanism 150 such that the ejection nozzle may be horizontally pivoted about the rotation center AX or moved up or down by the elevating rotary mechanism 150. The rear end of the ejection nozzle 148 is connected to the anti-drying solution supplier 158 via the valve 156. Thus, the ejection nozzle 148 is adapted to eject the anti-drying solution based on the open/close control of the valve 156.

As retaining the substrate W wet with the rinse liquid by means of the substrate retainer 102, the replacing unit 70 supplies the anti-drying solution (replacing solution) to the substrate W via the ejection nozzle 148, thereby replacing the rinse liquid adhered to the substrate W with the anti-drying solution. In the third embodiment, as well, the same liquids as those used in the first embodiment may be used as the anti-drying solution.

Figure 11:
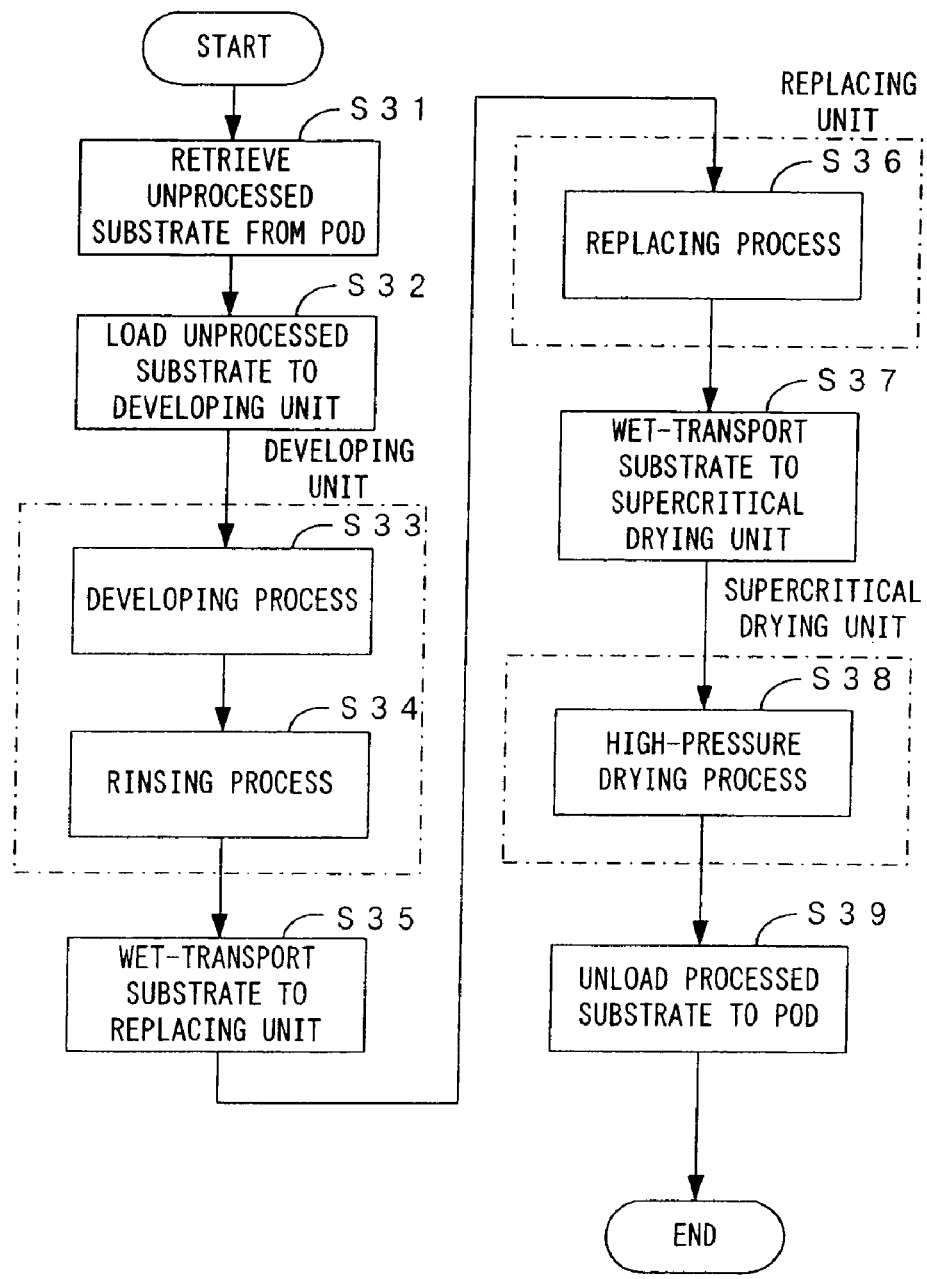
FIG. 11 is a flow chart representing the steps of operations of the substrate processing system of FIG. 8.

Next, the operations of the substrate processing system of the above construction will be described in details with reference to FIG. 11. FIG. 11 is a flow chart representing the steps of operations of the substrate processing system of FIG. 8. It is noted here that the description of the operations of the individual parts of the system focuses on a single substrate W in order to facilitate the comprehension of the operations.

An unprocessed substrate W accommodated in the pod P placed on the substrate station 40 is retrieved by the indexer robot 50 (Step S31) and then, is directly handed over to the primary transport robot 30 at the hand-over portion 60. Thus, the unprocessed substrate W is loaded in the substrate processing section PS. So receiving the unprocessed substrate W, the primary transport robot 30 moves to place in front of the developing unit 10C so as to deliver the substrate W to the developing unit 10C (Step S32). In the developing unit 10C, the substrate W is subjected to the developing process and the rinsing process in this order (Steps S33, S34). Subsequently, the substrate W as wetted with the rinse liquid is wet-transported to the replacing unit 70 by means of the primary transport robot 30 (Step S35: first transport step). This step is followed by the replacing process performed by the replacing unit 70 (Step S36). Specifically, the anti-drying solution (replacing solution) is supplied to the substrate W wet with the rinse liquid for replacing the rinse liquid with the anti-drying solution.

At completion of the replacing process, the substrate W as wetted with the anti-drying solution is wet-transported to the supercritical drying unit 20 by means of the primary transport robot 30 (Step S37: second transport step). Similarly to the first embodiment, the supercritical drying unit 20 performs the high-pressure drying process (supercritical drying process) for high-pressure drying of the substrate W (Step S38). Subsequently, the primary transport robot 30 picks up the substrate W from the spin chuck 210 to discharge the processed substrate W from the supercritical drying unit 20. Then, the robot performs the procedure reversed from that taken for loading the substrate, or the unloading operation so as to insert the processed substrate W in the pod P placed on the substrate station 40 (Step S39).

According to the embodiment as described above, the developing process is performed in the developing unit 10C whereas the high-pressure drying process is performed in the supercritical drying unit 20 in a dedicated manner. Similarly to the first embodiment, therefore, the sequential processes from the developing process to the high-pressure drying process can be favorably performed without limiting the type of a usable developing solution in the developing process or without producing the problem such as the corrosion in the pressure container 202 of the supercritical drying unit 20. In addition, the developing process in the developing unit 10C, the replacing process in the replacing unit 70 and the high-pressure drying process in the supercritical drying unit 20 are carried out in parallel so that the sequential processes from the developing process to the high-pressure drying process can be accomplished in a shorter time. Hence, the substrate can be processed efficiently. Furthermore, the substrate W subjected to the developing process and the rinsing process is wet-transported to the replacing unit 70 as maintained in the state wet with the rinse liquid. In the replacing unit 70, the rinse liquid adhered to the substrate W is replaced with the anti-drying solution. Thereafter, the substrate as wetted with the anti-drying solution is wet-transported to the supercritical drying unit 20. Therefore, the substrate W may be effectively prevented from becoming air-dry during the transportation thereof.

Accordingly, the processings of the substrate W may be favorably performed without causing damage to the substrate W.

Fourth Embodiment

Figure 12:
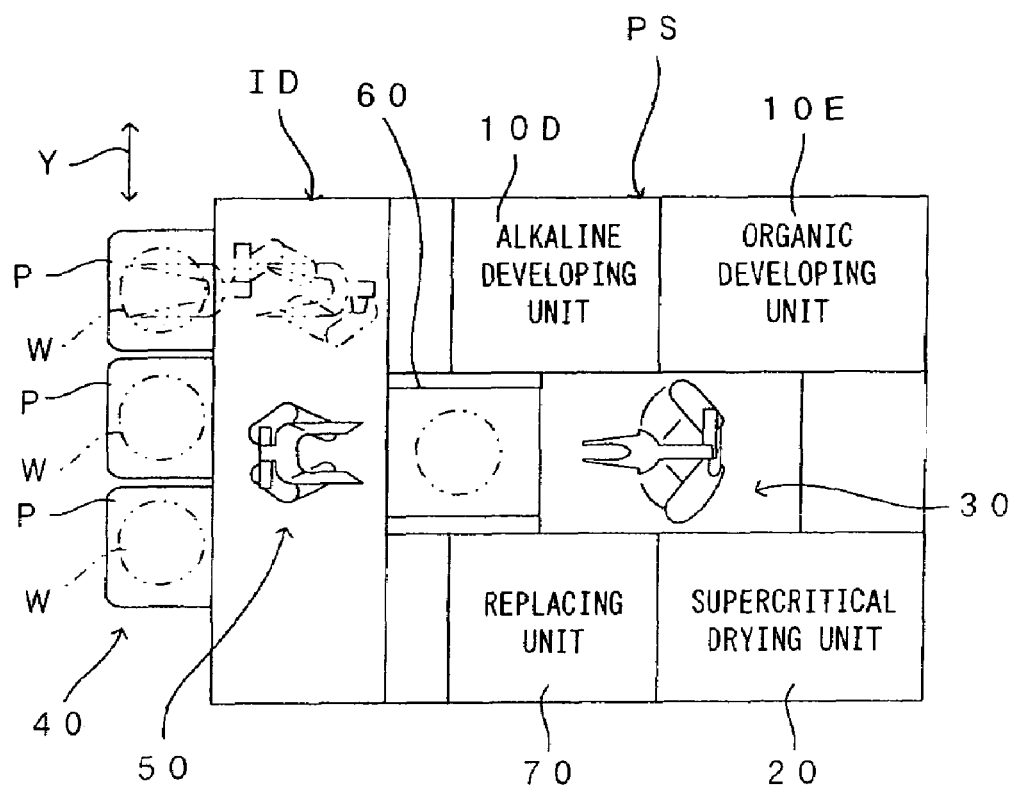
FIG. 12 is a diagram showing a substrate processing system according to a fourth embodiment of the present invention.

FIG. 12 is a diagram showing a substrate processing system according to a fourth embodiment of the present invention. The fourth embodiment differs from the second embodiment in the following points, the second embodiment wherein the developing units 10A, 10B perform the different developing processes, respectively. In the developing units 10A, 10B according to the second embodiment, the developing process, rinsing process and replacing process are carried out in the same apparatus. According to the fourth embodiment, on the other hand, the developing process and rinsing process are performed in a developing unit 10D or 10E, whereas the replacing process is carried out by the dedicated replacing unit 70. Furthermore, the primary transport robot 30 wet-transports the substrate W from the developing unit 10D, 10E to the supercritical drying unit 20 via the replacing unit 70. The other features are essentially the same as those of the second embodiment. Hereinafter, therefore, the same components will be represented by the same reference characters, respectively, the description of which will be dispensed with. The following description will be made focusing on the differences.

The developing units 10D, 10E are constructed the same way as the developing units 10A, 10B of the second embodiment except that the units 10D, 10E do not have a structure equivalent to replacing solution supply means for supplying the replacing solution to the substrate W. The replacing unit 70 is constructed the same way as the replacing unit 70 of the third embodiment. According to the fourth embodiment, the same solutions as those illustrated by the second embodiment may be used as the common replacing solution.

Figure 13:
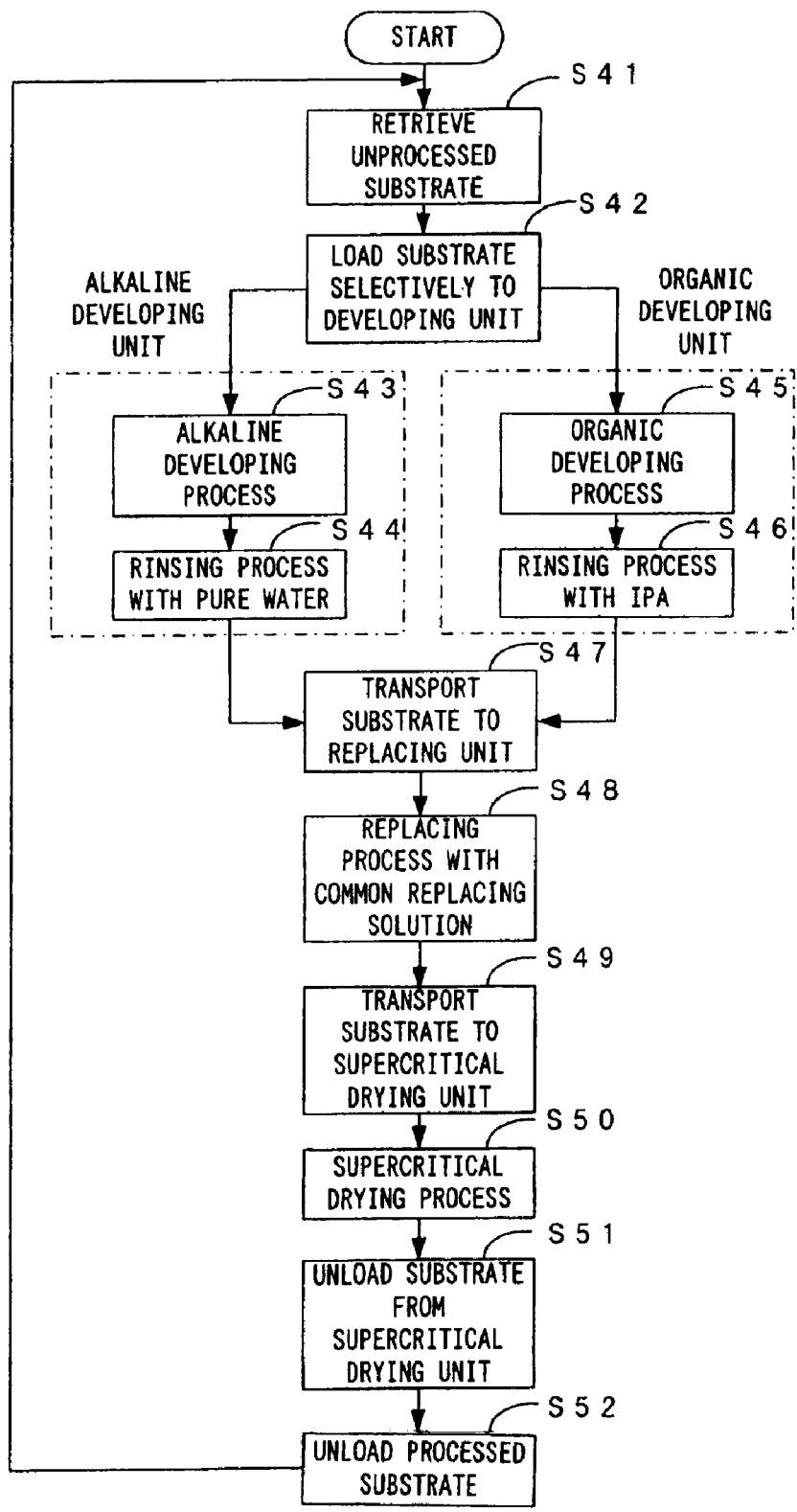
FIG. 13 is a flow chart representing the steps of operations of the substrate processing system of FIG. 12.

Next, the operations of the substrate processing system of the above construction will be described in details with reference to FIG. 13. FIG. 13 is a flow chart representing the steps of operations of the substrate processing system of FIG. 12. It is noted here that the description of the operations of the individual parts of the system focuses on a single substrate W in order to facilitate the comprehension of the operations.

An unprocessed substrate W accommodated in the pod P placed on the substrate station 40 is retrieved by the indexer robot 50 and then, is directly handed over to the primary transport robot 30 at the hand-over portion 60. Thus, the unprocessed substrate W is loaded in the substrate processing section PS (Step S41). So receiving the unprocessed substrate W, the primary transport robot 30 transports the substrate W to a developing unit corresponding to a film material forming a resist film on the substrate W (Step S42). Specifically, where the substrate W is to be subjected to the alkaline developing process, the primary transport robot 30 delivers the substrate W to the alkaline developing unit 10D. Where, on the other hand, the substrate W is to be subjected to the organic developing process, the primary transport robot 30 delivers the substrate W to the organic developing unit 10E.

When the substrate W is delivered to the alkaline developing unit 10D, the developing unit 10D performs the alkaline developing process (Step S43) and the rinsing process with pure water (Step S44) in this order. When, on the other hand, the substrate W is delivered to the organic developing unit 10E, the developing unit 10E performs the organic developing process (Step S45) and the rinsing process with IPA (Step S46) in this order. Without determining which of the developing units 10D, 10E has developed the substrate, the primary transport robot 30 wet-transports the substrate W, as wetted with the rinse liquid, to the replacing unit 70 (Step S47: first transport step). Subsequently, the replacing unit 70 performs the replacing process using the common replacing solution (Step S48).

The developing units 10D, 10E perform the different developing processes, respectively. However, the replacing unit 70 performs the replacing process, as the final process, using the common replacing solution so that the substrate is wetted with the common replacing solution.

After completion of the replacing process, the substrate W, as wetted with the anti-drying solution, is wet-transported to the supercritical drying unit 20 by means of the primary transport robot 30 (Step S49: second transport step). The supercritical drying unit 20 carries out the high-pressure drying process (supercritical drying process) for high-pressure drying of the substrate W (Step S50). Subsequently, the primary transport robot 30 picks up the substrate W from the spin chuck 210 so as to unload the processed substrate W from the supercritical drying unit 20 (Step S51). Then, the robot performs a procedure reversed from that taken for loading the substrate, or the unloading operation so as to insert the processed substrate W in the pod P placed on the substrate station 40 (Step S52).

According to the embodiment as described above, similarly to the third embodiment, the developing process is performed in the developing unit 10D, 10E while the high-pressure drying process is performed in the supercritical drying unit 20 in a dedicated manner. Therefore, the sequential processes from the developing process to the high-pressure drying process can be favorably performed without limiting the type of a usable developing solution in the developing process or without producing the problem such as the corrosion in the pressure container 202 of the supercritical drying unit 20. In addition, the alkaline developing unit 10D and the organic developing unit 10E are disposed in the same system so that the substrate W may be selectively subjected to either one of the two developing processes. Hence, the substrate processing system offers high versatility. Furthermore, the arrangement is made such that the substrate W developed by either of the developing units 10D, 10E may be transported to the supercritical drying unit 20 by means of the primary robot 30 regardless of which of the developing units 10D, 10E has developed the substrate. Thus, the primary transport robot 30 functions as the common transport unit. Accordingly, the system has a more simplified construction and is reduced in the size and cost as compared with a case where the dedicated transport units are provided in correspondence to the respective contents of the developing processes. Furthermore, the substrate W subjected to the developing process and the rinsing process is wet-transported to the replacing unit 70 as wetted with the rinse liquid. In the replacing unit 70, the rinse liquid adhered to the substrate is replaced with the anti-drying solution. Thereafter, the substrate wet with the anti-drying solution is wet-transported to the supercritical drying unit 20. Accordingly, the substrate W is effectively prevented from becoming air-dry during the transportation thereof. Hence, the processing may preferably be carried out without causing damage to the substrate W.

Others

It is to be understood that the present invention is not limited to the foregoing embodiments but various changes and modifications may be made thereto within the scope of the present invention. While the foregoing embodiments incorporate only one supercritical drying unit 20 in the substrate processing system, for example, the subject of the application of the present invention is not limited to the above. The invention may also be applied to a substrate processing system incorporating therein a plurality of supercritical drying units. In this case, the primary transport robot 30 may be adapted to access any of the plural supercritical drying units and may be so controlled as to unload the processed substrate from any of the plural developing units and then to transport the substrate selectively to one of the plural supercritical drying units. The substrate processing system as a whole can achieve an increased throughput by adopting such arrangement and control method.

Likewise to the aforementioned supercritical drying unit, the number of the developing units or the replacing units to be installed as the substrate processing units may be determined arbitrarily. According to the second and fourth embodiments, in particular, one alkaline developing unit 10A and one organic developing unit 10B are installed in the system. As a matter of course, the present invention is applicable to a substrate processing apparatus incorporating therein a plural number of alkaline developing units 10A and/or a plural number of organic developing units 10B.

According to the second and fourth embodiments, the alkaline developing unit 10A and the organic developing unit 10B are provided as the plural developing units individually performing the different developing processes on the substrate. Needless to say, the combination of the plural processing units is not limited to this.

While the foregoing embodiments carry out the developing process as the wet process of the present invention, the present invention may also be applied to other wet processes such as an etching process and rinsing process.

Although the substrate W is rotated at low speed during the high-pressure drying process (supercritical drying process) according to the foregoing embodiments, the high-pressure drying process may be carried out with the substrate W maintained in a standstill state. The high-pressure drying process is carried out by supplying the SCF from the SCF supplier 222 to the processing chamber 204. Alternatively, liquid carbon dioxide may be introduced in the pressure container 202 while the temperature in the pressure container 202 may be increased whereby the carbon dioxide is transformed into the supercritical state.

While the foregoing embodiments employ the traveling (mobile) primary transport 30 consisting of a scalar transport robot as the "transport unit" of the present invention, the structure of the transport unit is not limited to this. For instance, a stationary transport robot may be used. That is, all types of transport units for transporting the substrate may be applied to the present invention. Furthermore, the number of hands or the location of the transport unit may be determined arbitrarily.

According to the first and second embodiments, the replaced substrate W is directly transported from the developing unit 10A, 10B to the supercritical drying unit 20. According to the third and fourth embodiments, the rinsed substrate W is directly wet-transported from the developing unit 10C (or 10D, 10E) to the replacing unit 70, from which the replaced substrate W is directly transported to the supercritical drying unit 20. That is, the substrate W is wet-transported between the processing units as covered with the anti-drying solution or rinse liquid. Alternatively, the substrate W may be wet-transported as accommodated in a transport container. In this case, the substrate W may preferably be transported to the supercritical drying unit 20 as accommodated in the transport container holding therein a liquid of the same component as that of the anti-drying solution. This approach is more effective o prevent the substrate from becoming air-dry during the transportation of the substrate W to the supercritical drying unit 20.

Although the foregoing embodiments illustrate a so-called single wafer processing system wherein the substrate W is processed on a per-substrate basis in all the processes from the wet processes to the high-pressure drying process, a so-called batch process system may be adopted wherein plural substrates are processed in batch in all or some of these processes.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus comprising:
   an alkaline developing unit for performing an alkaline developing process for a substrate, said alkaline developing unit receiving an alkaline developing solution from an alkaline solution supplier that contains said alkaline developing solution;
   an organic developing unit for performing an organic developing process for a substrate, said organic developing unit receiving an organic developing solution from an organic solution supplier that contains said organic developing solution;
   a high-pressure processing unit for allowing a high-pressure fluid or a mixture of the high-pressure fluid and a chemical agent, as a processing fluid, to contact a surface of said developed substrate thereby performing a predetermined surface treatment for said developed substrate; and
   a transport unit common to said alkaline developing unit and said organic developing unit, capable of accessing said alkaline developing unit, said organic developing unit, and said high-pressure processing unit, for unloading the developed substrate from said alkaline developing unit and said organic developing unit and for loading said developed substrate into said high-pressure processing unit,
   wherein each of said alkaline developing unit and said organic developing unit includes:
   developing solution supply means for dispensing the corresponding developing solution to said substrate;
   rinse liquid supply means for dispensing a rinse liquid to said substrate; and
   replacing solution supply means for dispensing a replacing solution having a composition which is different from that of said rinse liquid to said substrate thereby replacing said rinse liquid with said replacing solution;
   wherein said alkaline developing unit and said organic developing unit each perform a replacing process as a final processing of said developing process for replacing the solution adhered to said substrate, with said replacing solution being common to said alkaline developing unit and said organic developing unit.

2. The substrate processing apparatus according to claim 1, wherein said transport unit wet-transports said developed substrate from any one of said alkaline developing unit and said organic developing unit to said high-pressure processing unit.

3. The substrate processing apparatus according to claim 1, comprising a plural number of said high-pressure processing units,
   wherein said transport unit is capable of accessing said plural high-pressure processing units for unloading said developed substrate from any one of said alkaline developing unit and said organic developing unit and for loading said developed substrate selectively to one of said plural high-pressure processing units.

4. The substrate processing apparatus according to claim 1, wherein said replacing solution is liquid for preventing said substrate from becoming air-dry during the transportation of the substrate from any one of said alkaline developing unit and said organic developing unit to said high-pressure processing unit.

5. A substrate processing apparatus comprising:
   an alkaline developing unit for performing an alkaline developing process for a substrate, said alkaline developing unit receiving an alkaline developing solution from an alkaline solution supplier that contains said alkaline developing solution;
   an organic developing unit for performing an organic developing process for a substrate, said organic developing unit receiving an organic developing solution from an organic solution supplier that contains said organic developing solution;
   a replacing unit for replacing a solution component adhered to said developed substrate with a replacing solution;
   a high-pressure processing unit for allowing a high-pressure fluid or a mixture of a high-pressure fluid and a chemical agent, as a processing fluid, to contact a surface of said substrate subjected to the replacing process thereby performing a predetermined surface treatment for said substrate subjected to the replacing process; and
   a transport unit common to said alkaline developing unit and said organic developing unit, capable of accessing said alkaline developing unit, said organic developing unit, said replacing unit and said high-pressure processing unit, for unloading the developed substrate from said alkaline developing unit and said organic developing unit and for loading said developed substrate into said replacing unit and for unloading the substrate subjected to the replacing process from said replacing unit and for loading said substrate subjected to the replacing process into said high-pressure processing unit,
   wherein each of said alkaline developing unit and said organic developing unit includes:
   developing solution supply means for dispensing the corresponding said developing solution to said substrate; and
   rinse liquid supply means for dispensing a rinse liquid to said substrate,
   wherein said replacing solution has a composition which is different from that of said rinse liquid; and
   wherein said replacing unit performs a replacing process for replacing the solution adhered to said substrate with said replacing solution being common to said alkaline developing unit and said organic developing unit.

6. The substrate processing apparatus according to claim 5, wherein said transport unit wet-transports said substrate among said plural developing units, said replacing unit and said high-pressure processing unit.

7. The substrate processing apparatus according to claim 5, comprising a plural number of said high-pressure processing units,
wherein said transport unit is capable of accessing said plural high-pressure processing units for unloading said substrate subjected to the replacing process from said replacing unit and for loading said substrate selectively to one of said plural high-pressure processing units.

8. The substrate processing apparatus according to claim 5, wherein said replacing solution is liquid for preventing said substrate from becoming air-dry during the transportation of the substrate from said replacing unit to said high pressure processing unit.

* * * * *